(12) United States Patent
Uchida et al.

(10) Patent No.: US 10,991,653 B2
(45) Date of Patent: Apr. 27, 2021

(54) SEMICONDUCTOR DEVICE AND METHOD OF MANUFACTURING THE SAME

(71) Applicant: RENESAS ELECTRONICS CORPORATION, Tokyo (JP)

(72) Inventors: Shinichi Uchida, Tokyo (JP); Yasutaka Nakashiba, Ibaraki (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 16/438,018

(22) Filed: Jun. 11, 2019

(65) Prior Publication Data

US 2019/0393148 A1 Dec. 26, 2019

(30) Foreign Application Priority Data

Jun. 22, 2018 (JP) .............................. JP2018-118863

(51) Int. Cl.
| | | |
|---|---|---|
| *H01L 21/00* | (2006.01) | |
| *H01L 23/522* | (2006.01) | |
| *H01L 49/02* | (2006.01) | |
| *H01L 27/092* | (2006.01) | |
| *H01L 21/8238* | (2006.01) | |
| *H01L 29/78* | (2006.01) | |
| *H01L 23/528* | (2006.01) | |
| *H01L 21/84* | (2006.01) | |
| *H01L 27/12* | (2006.01) | |

(52) U.S. Cl.
CPC .. *H01L 23/5225* (2013.01); *H01L 21/823871* (2013.01); *H01L 21/84* (2013.01); *H01L 23/5286* (2013.01); *H01L 27/092* (2013.01); *H01L 27/1203* (2013.01); *H01L 28/10* (2013.01); *H01L 29/7838* (2013.01)

(58) Field of Classification Search
CPC .... H01L 23/5225; H01L 28/10; H01L 27/092
See application file for complete search history.

(56) References Cited

U.S. PATENT DOCUMENTS

| | | | | |
|---|---|---|---|---|
| 6,452,249 B1* | 9/2002 | Maeda | ..................... | H01L 21/84 |
| | | | | 257/531 |
| 8,471,357 B2* | 6/2013 | Huang | ..................... | H01L 28/10 |
| | | | | 257/531 |
| 8,492,872 B2* | 7/2013 | Yang | ..................... | H01L 23/5225 |
| | | | | 257/531 |
| 8,686,539 B1* | 4/2014 | Kireev | ................ | H01L 23/5225 |
| | | | | 257/531 |
| 9,583,554 B1* | 2/2017 | Ler | ..................... | H01L 27/0207 |
| 9,607,942 B2* | 3/2017 | Yen | ..................... | H01L 23/5225 |
| 10,075,132 B2* | 9/2018 | Jones | ..................... | H03F 1/0288 |

(Continued)

FOREIGN PATENT DOCUMENTS

JP 2004-031922 A 1/2004

*Primary Examiner* — Laura M Menz
(74) *Attorney, Agent, or Firm* — McDermott Will & Emery LLP

(57) ABSTRACT

In a semiconductor device, a semiconductor substrate includes a bulk layer, a buried oxide layer provided in at least a partial region on the bulk layer, and a surface single crystal layer on the buried oxide layer. An inductor is provided above a main surface side of the semiconductor substrate on which the surface single crystal layer is disposed. To increase a Q value of the inductor, a ground shield is an impurity region formed in the bulk layer below the inductor and below the buried oxide layer.

17 Claims, 29 Drawing Sheets

(56) References Cited

U.S. PATENT DOCUMENTS

| | | | |
|---|---|---|---|
| 2007/0252731 A1* | 11/2007 | Chung | H01L 27/0722 341/50 |
| 2009/0146252 A1* | 6/2009 | Huang | H01L 28/10 257/531 |
| 2010/0193904 A1* | 8/2010 | Watt | H01L 23/5227 257/531 |
| 2011/0210792 A1* | 9/2011 | Kawakami | H03F 3/45183 330/253 |
| 2011/0235302 A1* | 9/2011 | Hijioka | H01L 23/5227 361/811 |
| 2014/0361401 A1* | 12/2014 | Wang | H01L 28/10 257/531 |
| 2015/0108603 A1* | 4/2015 | Yen | H01L 23/5225 257/531 |
| 2016/0148929 A1* | 5/2016 | Lee | H01L 27/0288 257/531 |
| 2018/0047667 A1* | 2/2018 | Uchida | H01L 28/10 |
| 2018/0076134 A1* | 3/2018 | Jing | H01L 23/5225 |
| 2019/0393148 A1* | 12/2019 | Uchida | H01L 27/1207 |
| 2020/0286826 A1* | 9/2020 | Yen | H01L 23/5227 |

\* cited by examiner

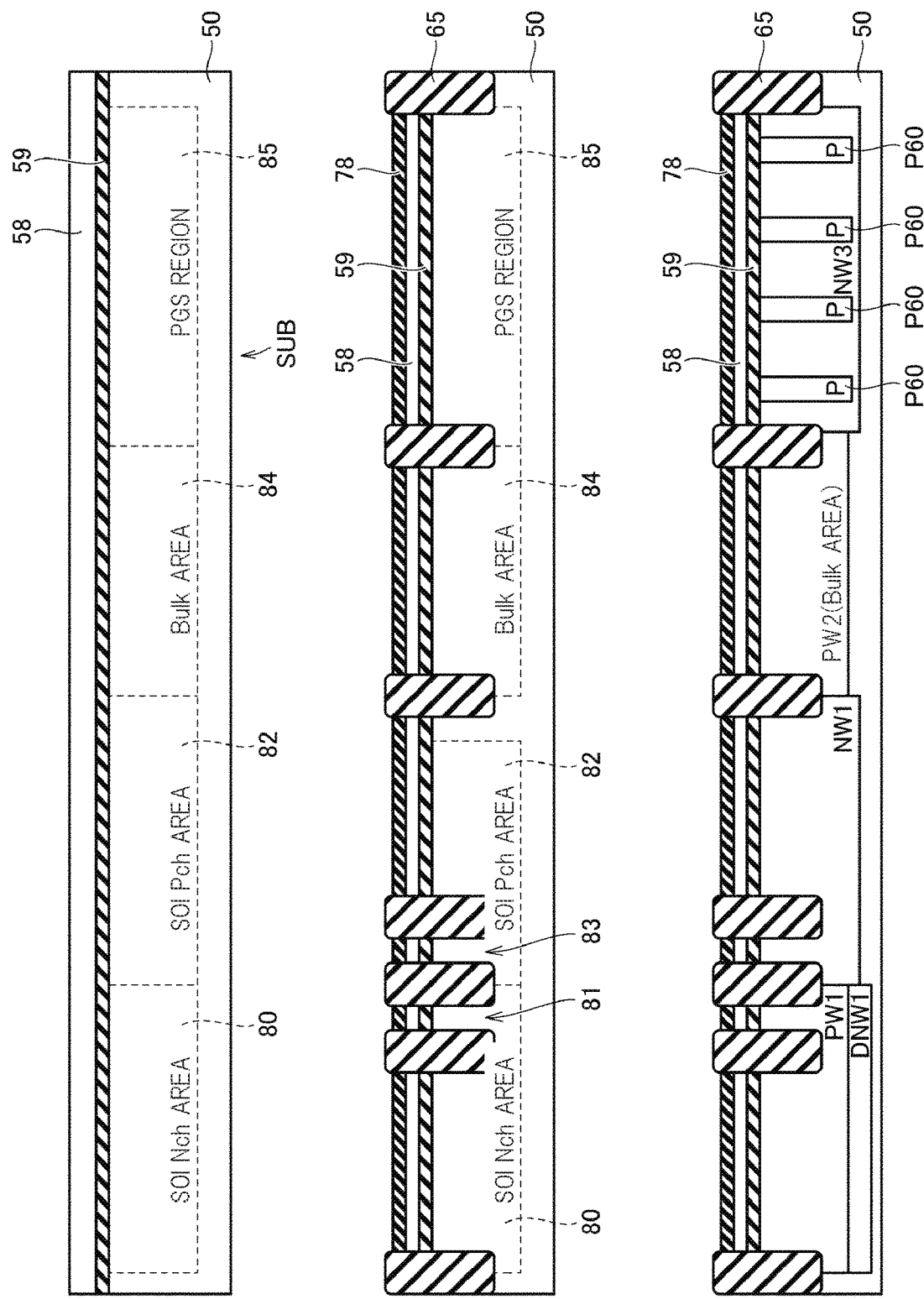

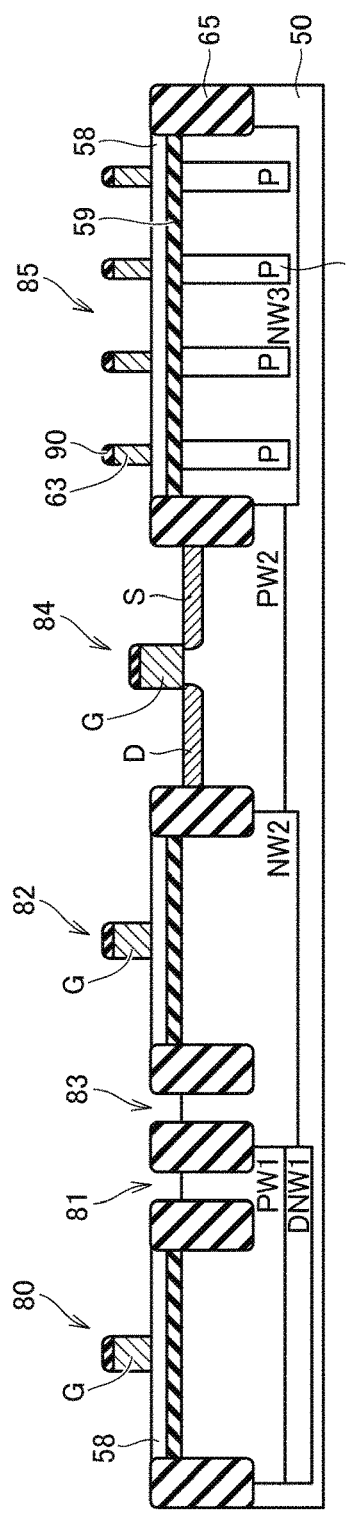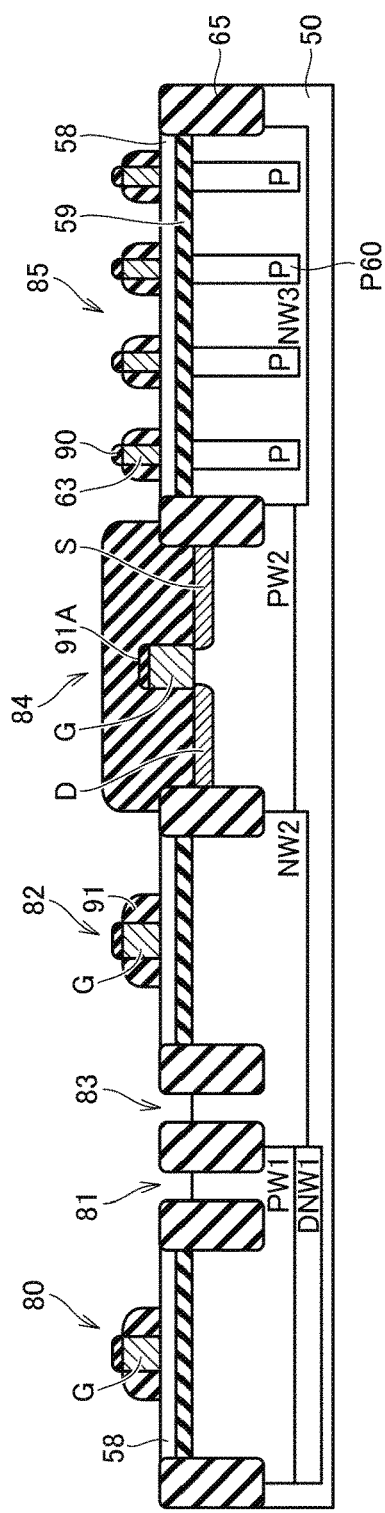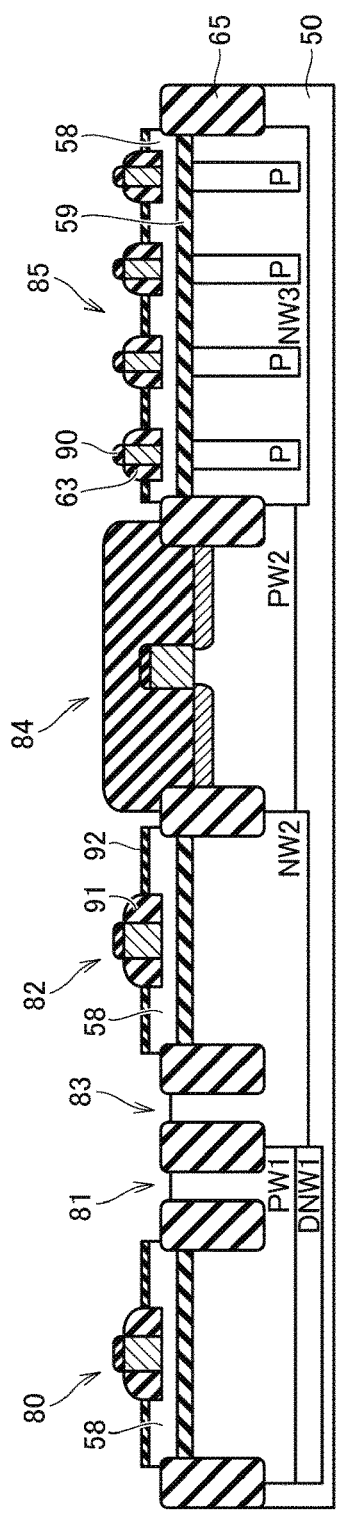

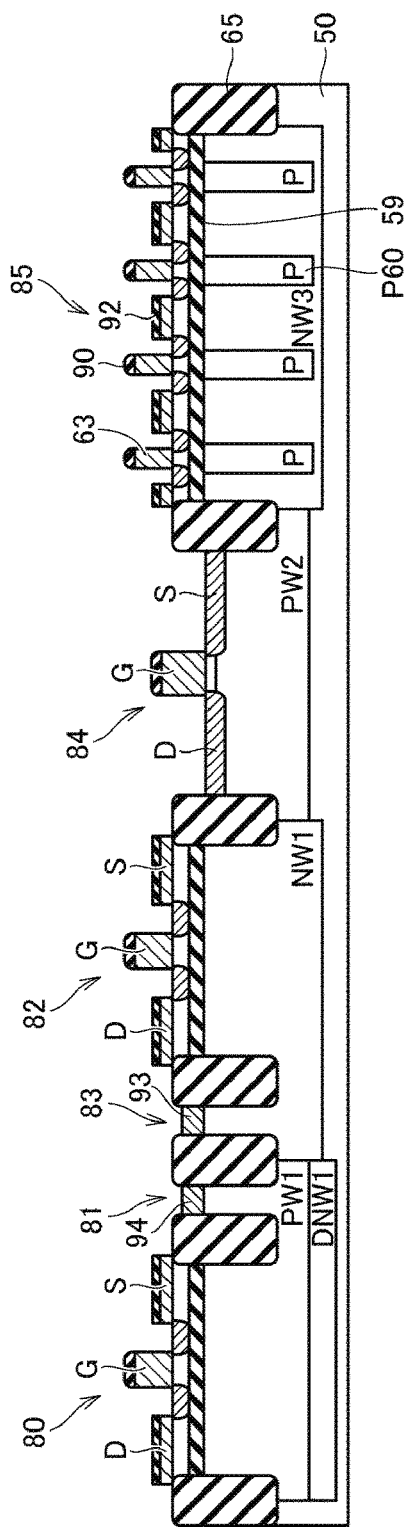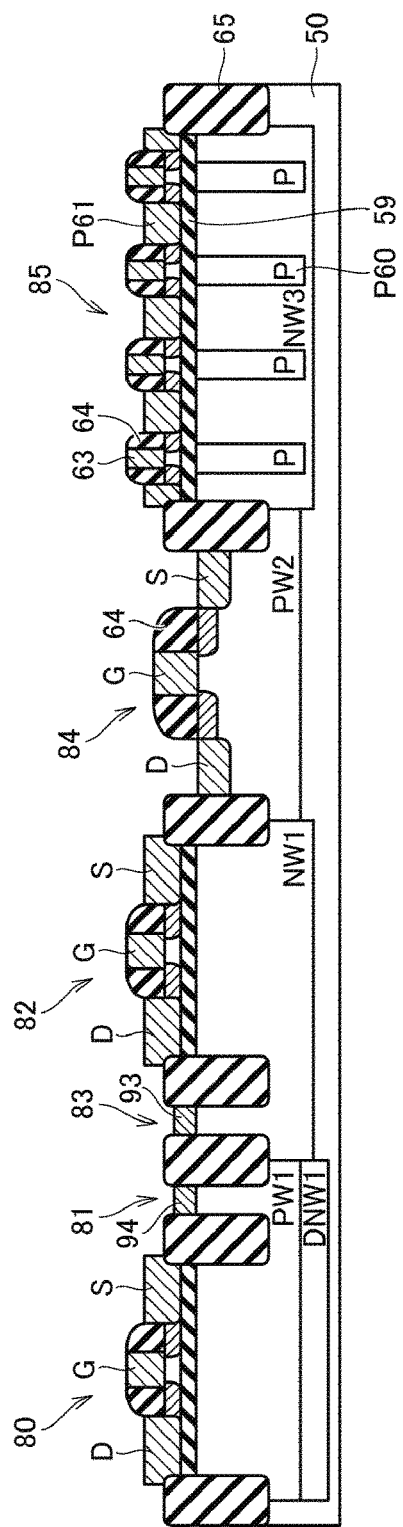
FIG. 11A
FIG. 11B

FIG. 14

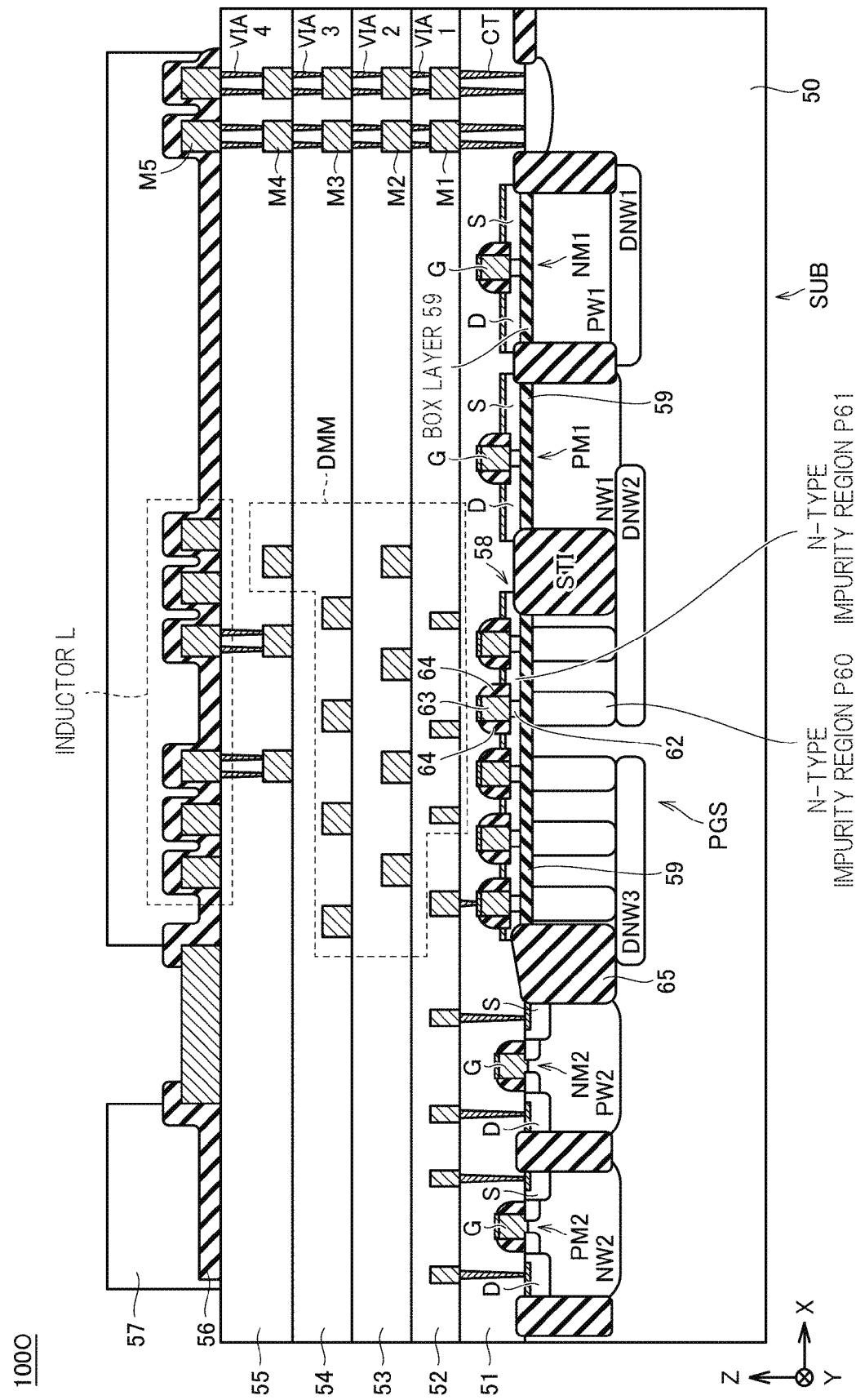

SEMICONDUCTOR DEVICE AND METHOD OF MANUFACTURING THE SAME

CROSS-REFERENCE TO RELATED APPLICATIONS

The disclosure of Japanese Patent Application No. 2018-118863 filed on Jun. 22, 2018 including the specification, drawings and abstract is incorporated herein by reference in its entirety.

BACKGROUND

The present disclosure relates to a semiconductor device and a method of manufacturing the semiconductor device, and the present disclosure relates to a semiconductor device and a method of manufacturing the semiconductor device, for example, to an LSI (Large Scale Integration) provided with an inductor.

When a high frequency circuit is formed using an Si (silicon) CMOS(Complementary Metal Oxide Semiconductor) transistor, a pattern ground shield (PGS: Patterned Ground Shield) is generally provided immediately below the inductor in order to suppress a reduction in the Q factor of the inductor.

For example, in a pattern ground shield described in Japanese unexamined Patent Application publication No. 2004-031922, a pattern ground shield is formed using both a metal wiring layer and a gate electrode layer.

SUMMARY

When the pattern ground shield is formed by using the metal wiring layer, the distance between the inductor and the pattern ground shield cannot be sufficiently secured, so that the parasitic capacitance between the inductor and the pattern ground shield becomes large. As a result, the Q value of the inductor is reduced. On the other hand, in the case where the pattern ground shield is formed using the gate electrode layer, although the distance from the inductor can be secured as compared with the metal wiring layer, the resistance value of polysilicon, which is the material of the gate electrode layer, is relatively large, so that a large amount of induced electromotive current flows through the bulk layer of the semiconductor substrate. As a result, the Q value of the inductor is reduced.

Japanese Patent Application Laid-Open No. 2004-31922 described above is a structure in which a pattern ground shield is formed by combining a metal wiring layer and a gate electrode layer, but it is difficult to say that loss due to induced electromotive current is sufficiently reduced. Other objects and novel features will become apparent from the description of this specification and the accompanying drawings.

A semiconductor device according to an embodiment includes an inductor and a pattern ground shield below the inductor. Pattern ground shields are formed using impurity regions located below buried oxide (BOX) layers of semiconductor substrate.

According to the above embodiment, the Q value of the inductor can be further increased.

BRIEF DESCRIPTION OF THE DRAWINGS

FIGS. 9A, 9B, and 9C are schematic cross-sectional views before production starts, after completion of step S110, and after completion of step S130 in FIG. 8.

FIGS. 10A, 10B, and 10C are schematic cross-sectional views after steps S160, S170, and S180 of FIG. 8 are completed.

FIGS. 11A and 11B are schematic cross-sectional views after steps S200 and S220 of FIG. 8 are completed.

FIG. 14 is a cross-sectional view showing the configuration of the semiconductor device of the fourth embodiment.

FIG. 24 is a cross-sectional view showing the configuration of the semiconductor device of the ninth embodiment.

DETAILED DESCRIPTION

Figure 1:
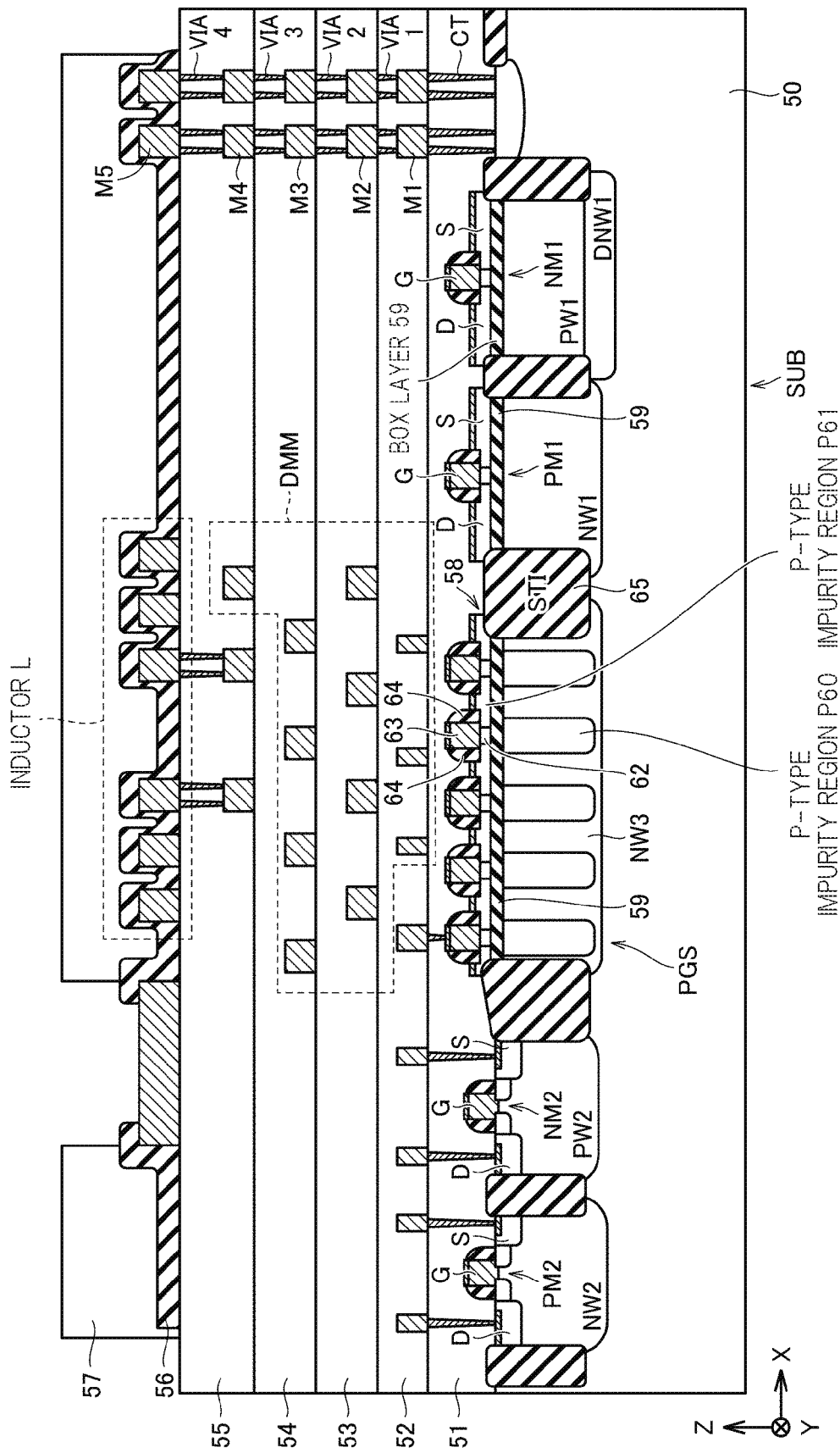
FIG. 1 is a cross-sectional view showing a configuration example of a semiconductor device according to a first embodiment.

Hereinafter, each embodiment will be described in detail with reference to the drawings. The same or corresponding portions are denoted by the same reference numerals, and description thereof will not be repeated. In addition, for ease of illustration, the dimensions of each part in the following cross-sectional views, plan views, and the like are not proportional to the actual dimensions.

First Embodiment

[Structure of Semiconductor Device]

FIG. 1 is a cross-sectional view showing a configuration example of a semiconductor device according to a first embodiment.

The semiconductor device 100 of FIG. 1 is formed using an SOI (Silicon On Insulator) substrate SUB. For example, as shown in FIG. 9A, the SOI substrate SUB includes a bulk layer 50, a BOX layer 59, and a surface single crystal layer 58 in this order. For example, a P-type silicon single crystal is used as the material of the bulk layer 50. A silicon oxide film is used as a material of the BOX layer 59. Silicon single crystal is used as a material of the surface single crystal layer 58. In the present disclosure, the SOI substrate may be referred to as a semiconductor substrate, and the surface single crystal layer 58 may be referred to as an SOI layer. The bulk layer 50 is also referred to as a support substrate for supporting the BOX layer 59 and the surface single crystal layer 58 thereon.

In the cross-sectional view of the present disclosure such as FIG. 1, the in-plane direction of the SOI substrate SUB is referred to as the X direction and the Y direction, and the direction perpendicular to the SOI substrate SUB is referred to as the Z direction. In the following description, the left and right directions of the sheet are defined as the X direction, and the front and rear directions of the sheet are defined as the Y direction.

The side on which the surface single crystal layer 58 is provided is referred to as the main surface side of the SOI substrate SUB. The direction from the bulk layer 50 toward the surface single crystal layer 58 is referred to as an upward direction (+Z direction), and the direction from the surface single crystal layer 58 toward the bulk layer 50 is referred to as a downward direction (−Z direction).

Referring to FIG. 1, a semiconductor device 100 includes an SOI substrate SUB, PMOS (P-channel MOS) transistors PM1 and PM 2, NMOS (N-channel MOS) transistors NM1 and NM2, a pattern ground shield PGS, and an inductor L. The PMOS transistors PM1 and PM2, the NMOS transistors NM1 and NM2, and the pattern ground shield PGS are formed on the main surface of the SOI substrate SUB. The inductor L is formed by using a metal wiring layer above the pattern ground shield PGS.

In addition, the semiconductor device 100 includes a shallow trench isolation (STI: Shallow Trench Isolation) 65 for device isolation. In the embodiment of FIG. 1, a STI65 is provided between neighboring transistors and between the transistors and the pattern ground shield PGS.

As will be described with reference to FIG. 2, the pattern ground shield PGS is configured to include a plurality of line-like patterns in plan view. In FIG. 1, a cross-sectional shape of a portion having a plurality of line-like patterns is shown. Accordingly, in the cross-sectional view of FIG. 1, the pattern ground shield PGS extends in the Y direction.

The PMOS transistor PM1 and the NMOS transistor NM1 of FIG. 1 are formed as fully depleted SOI (FDSOI: Fully Depleted Silicon On Insulator) type transistors.

Specifically, the FDSOI type PMOS transistor PM1 includes a BOX layer 59, a drain D and a source S that are P-type impurity regions formed on the surface single crystal layer 58, a channel region between the drain D and the source S, and a gate electrode G formed over the channel region via a gate insulator film (not shown). The material of the gate electrode G is polysilicon. Further, the FDSOI type PMOS transistor PM1 includes an N-type well NW1 formed under the BOX layer 59. The drain D, the source S, and the channel region are insulated from the N-type well NW1 with the BOX layer 59 interposed therebetween.

Similarly, the FDSOI type NMOS transistor NM1 includes a BOX layer 59, a drain D and a source S that are N-type impurity regions formed on the surface single crystal layer 58, a channel region between the drain D and the source S, and a gate electrode G formed over the channel region via a gate insulator film (not shown). Further, the FDSOI type NMOS transistor NM1 includes a P-type well PW1 formed under the BOX layer 59. The drain D, the source S, and the channel region are insulated from the P-type well PW1 with the BOX layer 59 interposed therebetween. In FIG. 1, a deep N-type well DNW1 is formed below the P-type well PW.

On the other hand, the PMOS transistor PM2 and the NMOS transistor NM2 are formed as bulk-type transistors. The bulk transistor has a conventional structure in which a BOX layer is not provided.

Specifically, the bulk-type PMOS transistor PM2 includes an N-type well NW2, a drain D and a source S which are P-type impurity regions formed above the N-type well NW2, a channel region between the drain D and the source S, and gate electrodes G formed on the channel region via a gate insulating film (not shown). Similarly, the bulk-type NMOS transistor NM2 includes a P-type well PW2, a drain D and a source S which are N-type impurity regions formed above the P-type well PW2, a channel region between the drain D and the source S, and gate electrodes G formed on the channel region via a gate insulating film (not shown).

The end portion of the gate electrode G and the end portion of the polysilicon ground shield 63, which is a part of the pattern ground shield PGS described later, are covered with a sidewall 64 formed using an insulator such as a silicon oxide film.

The pattern ground shield PGS is formed using the same processes as those of the FDSOI type PMOS transistor PM1. Therefore, there is an advantage that a special process for forming the pattern ground shield PGS is not required.

More specifically, the pattern ground shield PGS includes a polysilicon ground shield 63 which is a ground shield formed of polysilicon at the same time as the gate electrode G above the BOX layer 59. The polysilicon ground shield 63 is insulated from the semiconductor layer 62 and the P-type ground shield P61, which will be described later, with a thin film insulating film (not shown) corresponding to the gate insulating film interposed therebetween. The polysilicon ground shield 63 is configured as a plurality of line-like patterns in plan view of the SOI substrate SUB, and in FIG. 1, a cross section of a portion extending in the Y direction is shown.

The pattern ground shield PGS further includes a P-type ground shield P60 which is a P-type impurity region formed below the BOX layer 59. The P-type ground shield P60 is configured as a plurality of line-like patterns in plan view of the SOI substrate SUB, and in FIG. 1, a cross section of a portion extending in the Y direction is shown. In this specification, the pattern ground shield PGS formed by the N-type impurity region is referred to as an N-type pattern ground shield. The P-type pattern ground shield and the N-type pattern ground shield are collectively referred to as an impurity pattern ground shield.

One feature of the semiconductor device 100 of the present embodiment is that the P-type impurity region below the BOX layer 59 is used as the pattern ground shield PGS. Since the P-type ground shield P60 is farther away from the inductor L than the polysilicon ground shield 63, the coupling capacitance with the inductor L is not increased. Further, since the conductivity of the P-type ground shield P60 can be increased more than that of the polysilicon ground shield 63 by increasing the impurity concentration, the loss can be reduced.

In the semiconductor device 100 of the first embodiment, the P-type ground shield P60 is formed in the N-type well NW3 at the same time as the P-type well PW1 of the FDSOI type NMOS transistor NM1 and the P-type well PW2 of the bulk-type NMOS transistor NM2. Therefore, the thickness of the P-type ground shield P60 along the direction perpendicular to the main surface of the SOI substrate SUB (i.e., the distance in the depth direction from the upper end to the lower end of the P-type ground shield P60) is equal to the thickness of the P-type wells PW1 and PW2 along the direction perpendicular to the main surface of the SOI substrate SUB.

Further, a P-type ground shield P61, which is a P-type impurity region formed at the same time as the drain D and the source S above the BOX layer 59, may be further used as the pattern ground shield PGS. Portions of the P-type ground shields P61 corresponding to the sources S and the drains D are insulated from each other with the semiconducting layers 62 corresponding to the channel regions of the FDSOI type PMOS transistors PM1 interposed therebetween. In plan view of the SOI substrate SUB, the P-type ground shield P61 corresponding to the source S and the drain D is disposed adjacent to the polysilicon ground shield 63 corresponding to the gate electrode G.

In the example of FIG. 1, the inductor L is formed using the uppermost metal wiring layer. The inductor L is not necessarily formed using the uppermost metal wiring layer, and may be formed using a metal wiring layer lower than the uppermost metal wiring layer or a plurality of metal wiring layers. However, in order to suppress the capacitive coupling between the inductor L and the pattern ground shield PGS, it is preferable to increase the distance between the inductor L and the pattern ground shield PGS by forming the inductor L with at least one metal wiring layer of the upper layer as much as possible.

In the example of FIG. 1, five metal wiring layers M1 to M5 are provided as metal wiring layers. The lowermost metal wiring layer M1 is formed above the PMOS transistors PM1 and PM2, the NMOS transistors NM1 and NM2, and the pattern ground shield PGS with the interlayer insulating layer 51 interposed therebetween. The second metal wiring layer M2 is formed above the metal wiring layer M1 with the interlayer insulating layer 52 interposed therebetween. Similarly, the third metal wiring layer M3 is formed above the metal wiring layer M2 with the interlayer insulating layer 53 interposed therebetween. The fourth metal wiring layer M4 is formed above the metal wiring layer M3 with the interlayer insulating layer 54 interposed therebetween. The metal wiring layer M5 of the fifth layer is formed above the metal wiring layer M4 with the interlayer insulating layer 55 interposed therebetween.

The surface of the uppermost metal wiring layer M5 is covered with surface protection layers 56 and 57. As shown in FIG. 1, when electric connections are required between upper and lower metal wiring layers, they are connected via vias (VIA1~VIA5). Additionally, if an electrical connection is required between the lowermost metal wiring layer M1 and the bulk layer 50 or impurity region, it is connected via a contact CT. Silicide is formed on the surface of the impurity region in a portion connected to the contact CT.

In FIG. 1, the dummy metal DMM is inserted by using the metal wiring layers M1 to M4 between the inductor L and the pattern ground shield PGS. The dummy metal DMM is for making the distribution of the metal material uniform over the entire chip. This makes it possible to obtain a uniform polishing amount over the entire chip during the chemical mechanical polishing.

[Planar Layout of Inductor and Pattern Ground Shield]

Figure 2A:
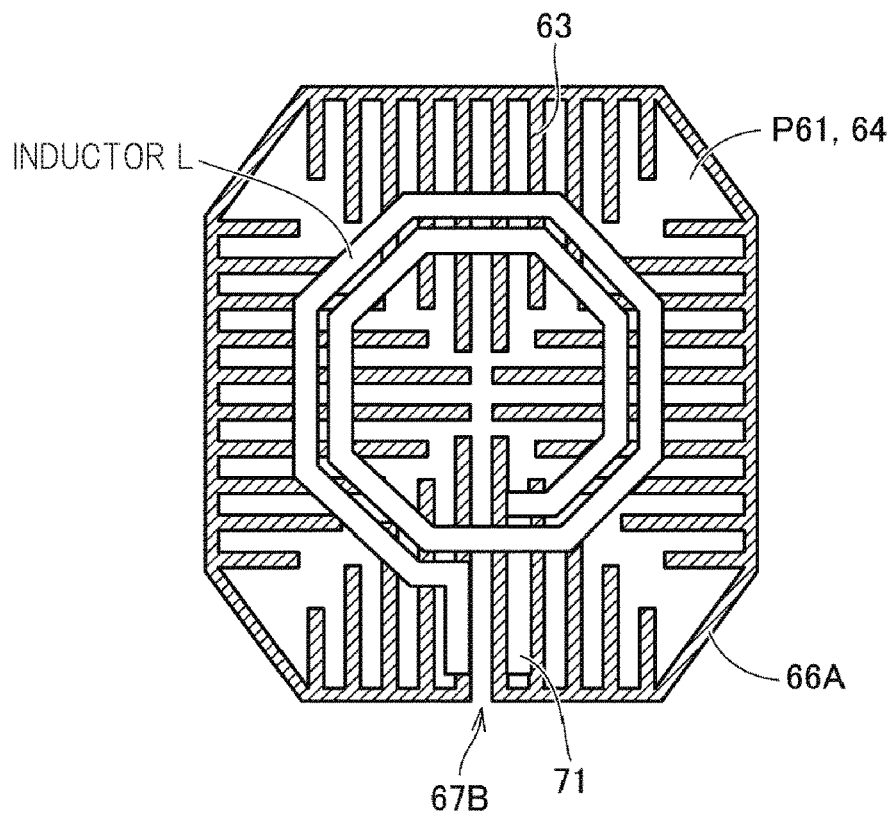
FIGS. 2A and 2B are plan views showing an example of a layout of an inductor and a pattern ground shield of the semiconductor device of FIG. 1
Figure 2B:
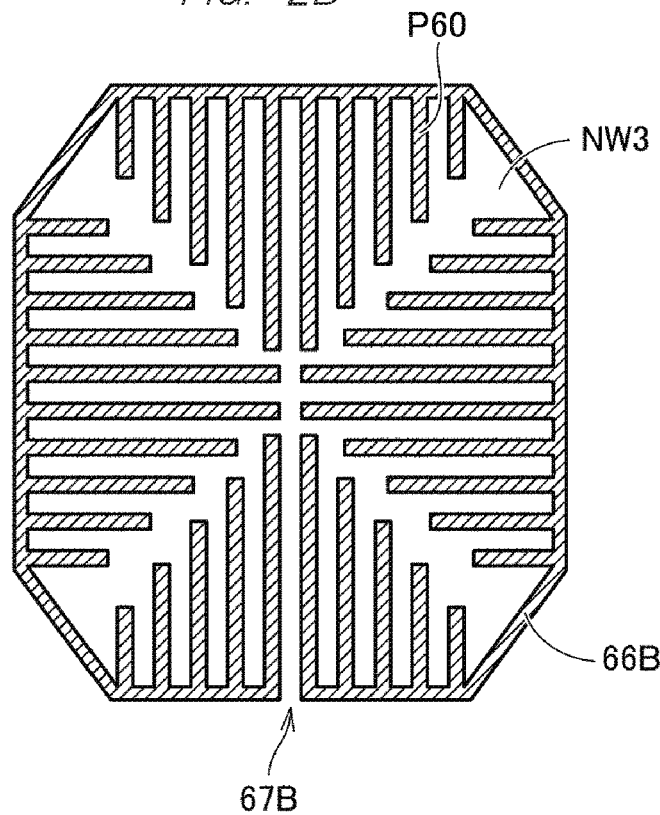

FIG. 2 is a plan view showing an example of a layout of an inductor and a pattern ground shield of the semiconductor device of FIG. 1. FIG. 2A shows a planar layout of the inductor L and a layout of a polysilicon ground shield 63 constituting the pattern ground shield PGS above the BOX layer 59. FIG. 2B shows a layout of a P-type ground shield P60 constituting the pattern ground shield PGS below the BOX layer 59. For ease of illustration, polysilicon ground shield 63 and P-type ground shield P60 are hatched.

Referring to FIG. 2A, inductor L is formed as a planar spiral inductor using metal wiring layer M5. A lead wiring 71 using the metal wiring layer M4 is formed at the intersection with the spiral wiring. The spiral wiring and the lead wiring 71 are connected to each other through a via (not shown).

Note that the planar shape of the inductor L is not limited to a substantially regular octagon shape as shown in FIG. 2A, and may be a square shape or a meander shape.

The polysilicon ground shield 63 above the BOX layer 59 is formed with a large number of cuts in plan view for the purpose of reducing eddy current loss. Such a ground shield having a plurality of line-like patterns is generally referred to as a pattern ground shield. In order to apply a common fixed potential to the polysilicon ground shield 63, the plurality of line-like patterns are electrically connected to each other. In the case of FIG. 2A, a connection wiring 66A for interconnecting a plurality of line-like patterns is provided in the outer peripheral portion of the region where the plurality of line-like patterns are provided. However, a notch 67A is provided in a part of the connection wiring 66 A so as not to generate an eddy current.

Referring to FIG. 2B, a P-type ground shield P60 under the BOX layer 59 is also formed as a patterned ground shield in which a large number of cuts are formed, similarly to the polysilicon ground shield 63. In order to apply a common fixed potential to the P-type ground shield P60, a connection wiring 66B for connecting a plurality of line-like patterns to each other is provided in an outer peripheral portion of a region where a plurality of line-like patterns are provided. However, a notch 67B is provided in a part of the connection wiring 66B so as not to generate an eddy current.

In the case of FIG. 2, the polysilicon ground shield 63 and the P-type ground shield P60 are formed so as to overlap each other in plan view of the SOI substrate SUB. However, it is not always necessary to match the planar shapes of the two. For example, in a plan view of the SOI substrate SUB, a plurality of line-like patterns constituting the polysilicon ground shield 63 and a plurality of line-like patterns constituting the P-type impurity region P60 may be alternately arranged.

[Method of Supplying Fixed Potential to Pattern Ground Shield]

A fixed potential is supplied to the polysilicon ground shield 63 and the P-type ground shields P60 and P61 that constitute the pattern ground shield PGS.

The polysilicon ground shield 63 and the P-type ground shield P61 shown in FIG. 2A may be supplied with a power supply potential as a fixed potential or a ground potential. The P-type ground shield P60 shown in FIG. 2B may also be supplied with a power supply potential or a ground potential as a fixed potential, but it is preferable to supply a ground potential from the viewpoint of design. In this case, to isolate the bulk layer 50, a power potential is supplied to the N-well NW3 and a ground potential is provided to the bulk layer 50, which is a P-type semiconductor.

When both the polysilicon ground shield 63 and the P-type ground shield P60 are connected to the ground terminal to supply the ground potential to both of them, the ground terminal may be common to other circuits or may be separate from each other. The ground terminal for connecting the polysilicon ground shield 63 and the ground terminal for connecting the P-type ground shield P60 may be the same or may be separate from each other.

Figure 3:
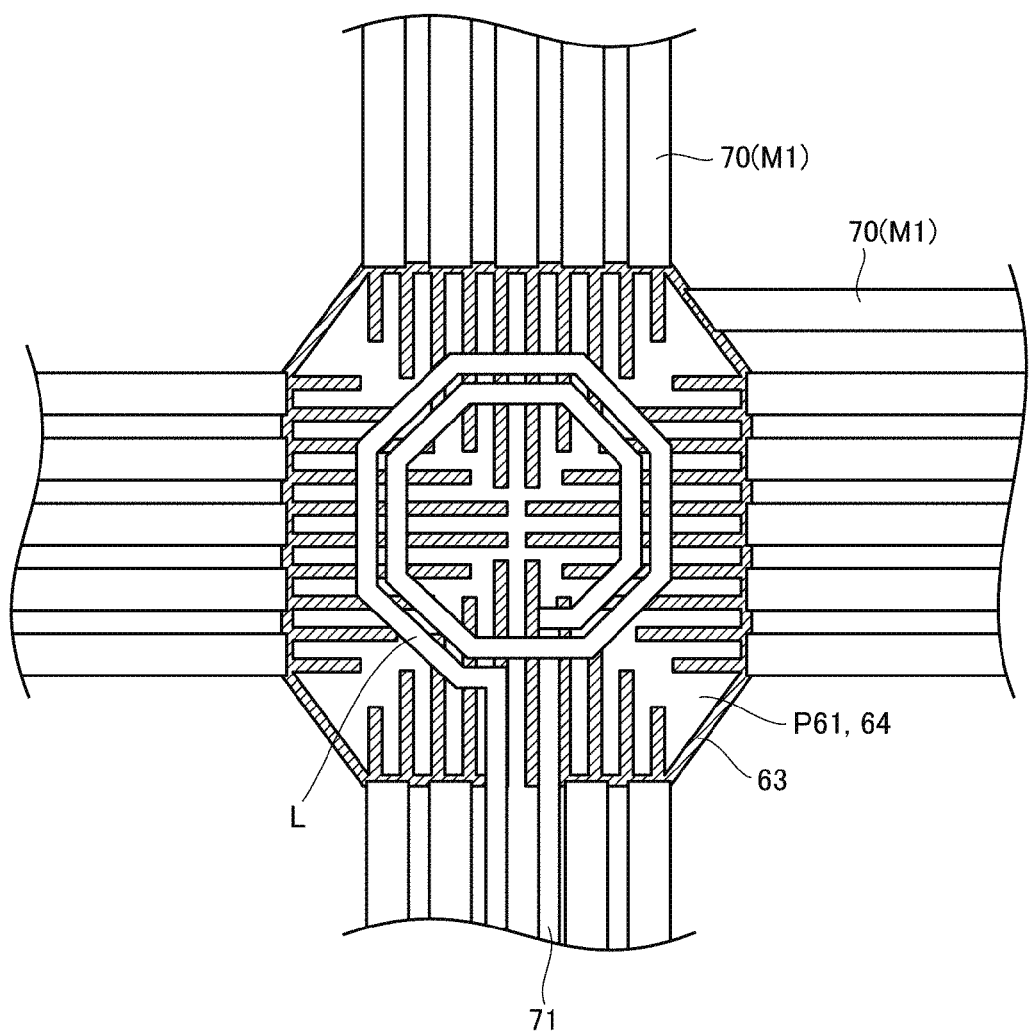
FIG. 3 is a diagram for explaining a method for supplying a fixed potential to the polysilicon ground shield of FIG. 2 (A)

FIG. 3 is a diagram for explaining a method of supplying a fixed potential to the polysilicon ground shield of FIG. 2A. Referring to FIG. 3, a connection wiring, which is an outer peripheral portion of the polysilicon ground shield 63, is connected to a wiring 70 for supplying a fixed potential formed by a metal wiring layer M1 through a contact (not shown).

Figure 4:
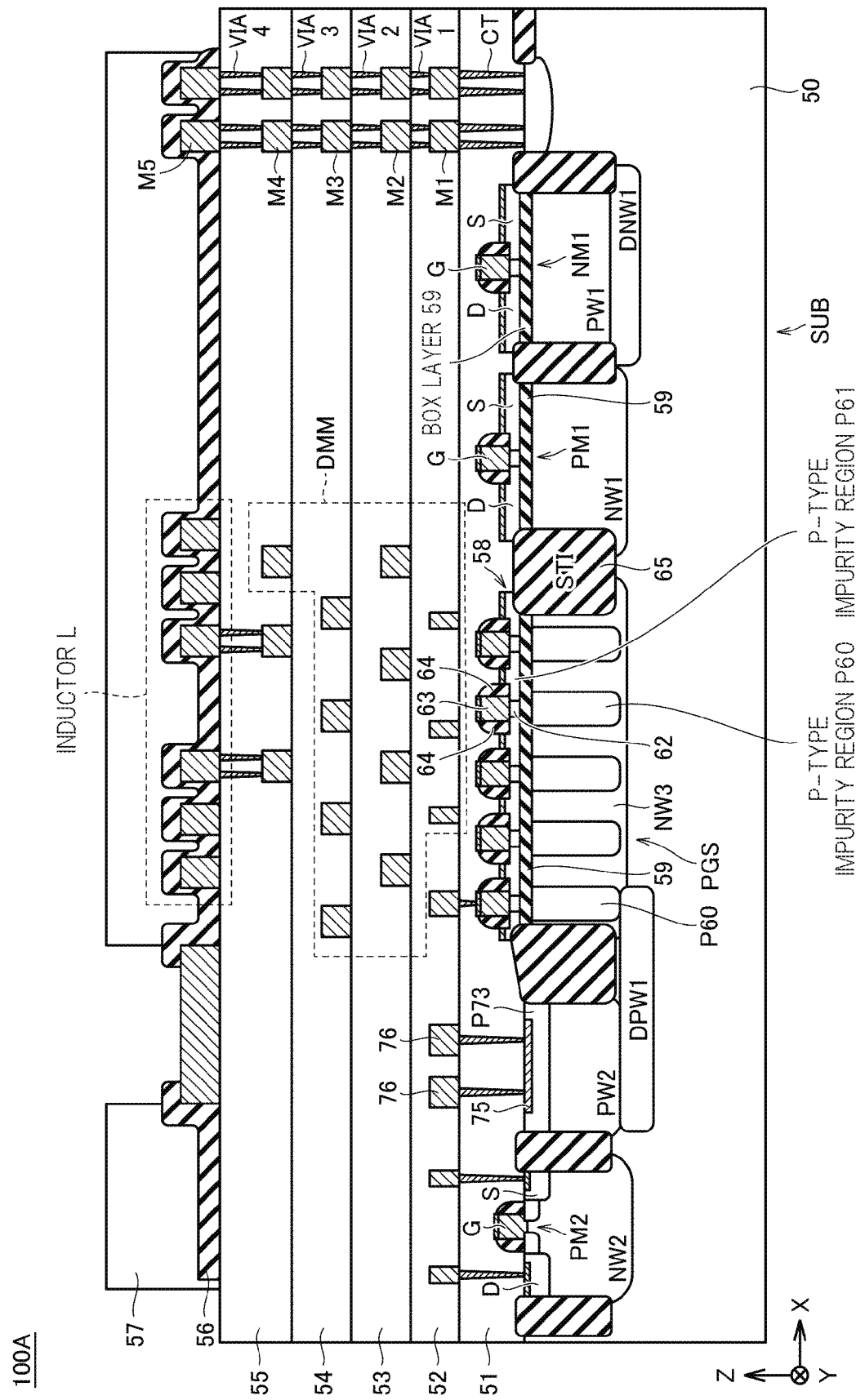
FIG. 4 is a cross-sectional view for explaining a method of supplying a fixed potential to the P-type ground shield shown in FIG. 2B.

FIG. 4 is a cross-sectional view for explaining a method of supplying a fixed potential to the P-type ground shield shown in FIG. 2B. For convenience, the semiconductor device 100A of FIG. 4 is shown as a modification of the semiconductor device 100 shown in FIG. 1, but in practice, the cross-sectional view of FIG. 4 may be considered as showing a cross-sectional structure of the semiconductor device 100 in a portion different from that of FIG. 1.

The semiconductor device 100A of FIG. 4 differs from the semiconductor device 100 of FIG. 1 in that P-type impurity regions P73 are formed above the P-type well PW2 instead of the bulk-type NMOS transistor NM2. A silicide 75 is formed on the P-type impurity region P73, and is connected to a fixed potential supply wiring 76 formed in the metal wiring layer M1 via a contact CT.

Further, the semiconductor device 100A of FIG. 4 differs from the semiconductor device 100 of FIG. 1 in that it further includes a deep P-type well DPW1 for connecting the lower portion of the P-type well PW2 and the lower portion of the P-type ground shield P60. As a result, the grounding potential is supplied to the P-type ground shield P60 through the fixed potential supply line 76, the P-type impurity region P73, the P-type well PW2, and the deep P-type well DPW1 in this order. Since the other points in FIG. 4 are the same as those in FIG. 1, the same or corresponding portions are denoted by the same reference numerals, and description thereof will not be repeated.

Figure 5:
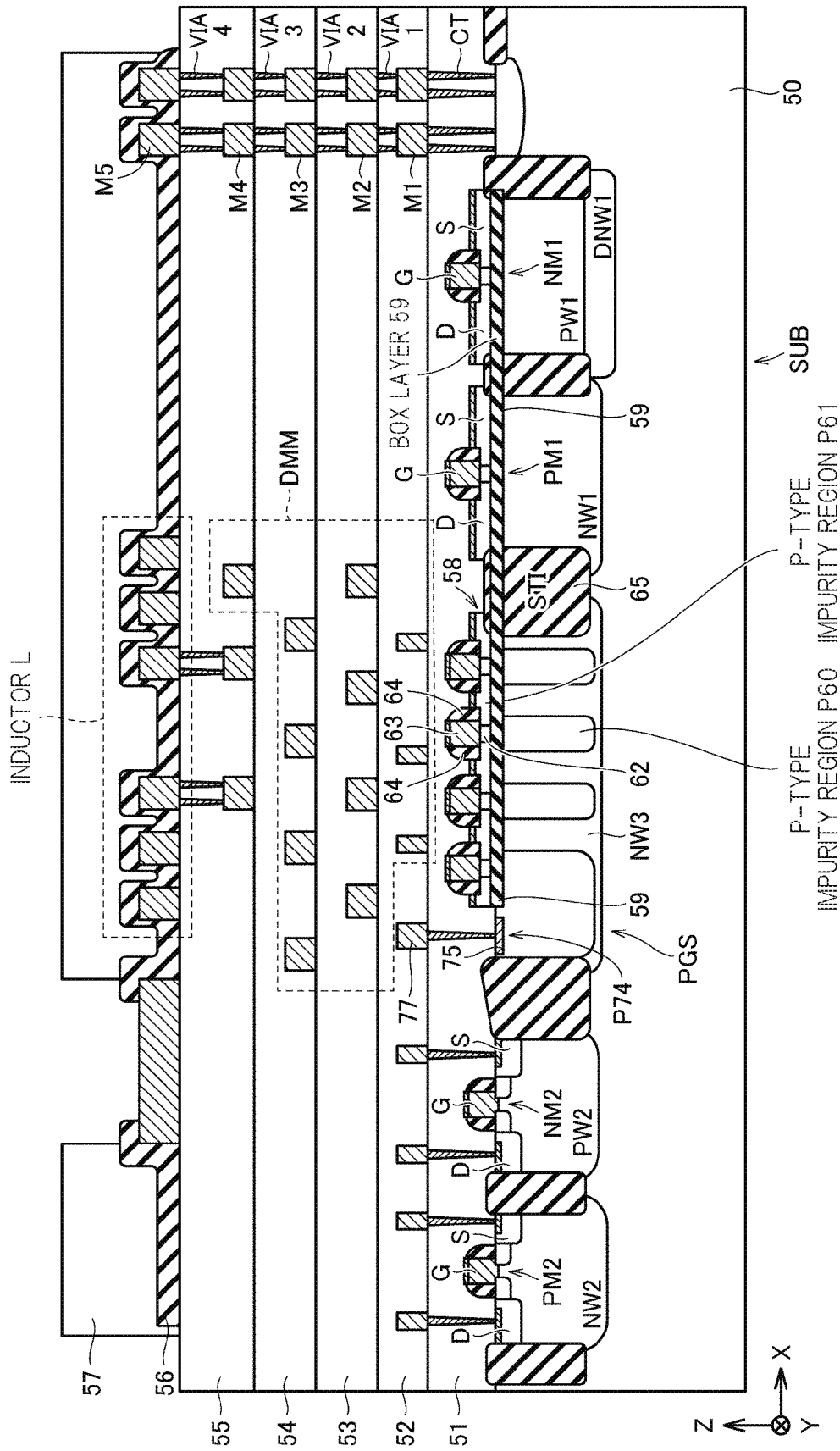
FIG. 5 is a cross-sectional view for explaining another method of supplying a fixed potential to the P-type impurity region shown in FIG. 2B.

FIG. 5 is a cross-sectional view for explaining another method of supplying a fixed potential to the P-type impurity region shown in FIG. 2B. FIG. 5 shows a cross-sectional view of a semiconductor device 100B as a modification of the semiconductor device 100 shown in FIG. 1.

In the semiconductor device 100B of FIG. 5, a part of the surface single crystal layer 58 and the BOX layer 59 provided above the P-type ground shield P60 is removed, and an upper portion (referred to as an exposed portion P 74) of the P-type impurity region constituting the P-type ground shield P60 is exposed. The silicide 75 formed in the exposed portion P 74 and the fixed potential supply wiring 77 formed in the metal wiring layer M1 are connected via a contact CT. With this configuration, the ground potential is supplied from the fixed potential supply wiring 77 to the P-type ground shield P60 via the contact CT. Since the other points in FIG. 5 are the same as those in FIG. 1, the same or corresponding portions are denoted by the same reference numerals, and description thereof will not be repeated.

[Variation of the Pattern Ground Shield]

Figure 6:
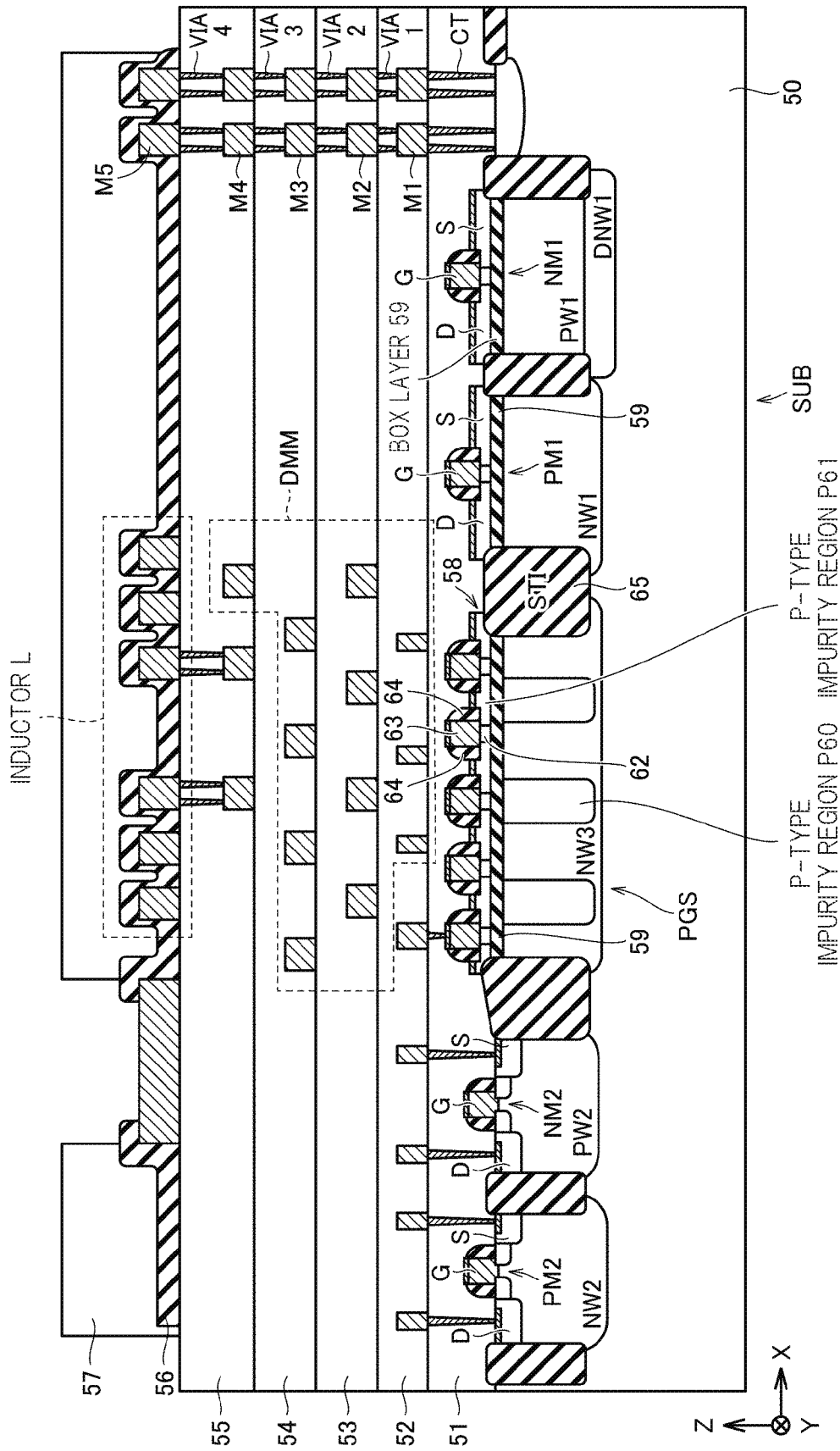
FIG. 6 is a cross-sectional view showing a configuration of a variation of the semiconductor device of FIG. 1.

FIG. 6 is a cross-sectional view showing a configuration of a variation of the semiconductor device of FIG. 1. The semiconductor device 100C of FIG. 6 differs from the semiconductor device 100 of FIG. 1 in that the size and arrangement of the P-type ground shield P60 provided under the BOX layer 59 are changed.

Specifically, in the case of the semiconductor device 100 of FIG. 1, the line-like pattern constituting the polysilicon ground shield 63 provided above the BOX layer 59 and the line-like pattern constituting the P-type ground shield P60 provided below the BOX layer 59 overlap with the SOI substrate SUB when viewed from the vertical direction. On the other hand, in the case of the semiconductor device 100C of FIG. 6, the width of each line-like pattern constituting the P-type ground shield P60 is wider than the width of each line-like pattern formed by the polysilicon ground shield 63. Further, the pitch of the plurality of line-like patterns constituting the P-type ground shield P60 is wider than the pitch of the plurality of line-like patterns constituting the polysilicon ground shield 63.

In general, the polysilicon ground shield 63 whose shape is determined by etching can be processed finer than the P-type ground shield P60 formed by ion implantation. Therefore, it is easier to manufacture the polysilicon ground shield 63 and the P-type ground shield P60 so as to have the above-described arrangement and size relationship.

Even in the above-described arrangement, since the polysilicon ground shield 63 and the P-type ground shield P60 are insulated by the BOX layer 59, there is no problem. That is, the line-like pattern formed by the P-type ground shield P60 below the BOX layer 59 can be freely arranged regardless of the arrangement of the line-like pattern of the polysilicon ground shield 63 above the BOX layer 59.

As another arrangement example, a plurality of line-like patterns constituting the polysilicon ground shield 63 and a plurality of line-like patterns constituting the P-type ground shield P60 may be alternately arranged when viewed from a direction perpendicular to the SOI substrate SUB. That is, the SOI substrate SUB may be formed in plan view so that there is no gap between the plurality of line-like patterns constituting the polysilicon ground shield 63 and the plurality of line-like patterns constituting the P-type ground shield P60. As a result, the magnetic field reaching the bulk layer 50 from the inductor L can be further weakened, so that the loss due to the eddy current flowing through the bulk layer 50 can be further reduced.

As shown in FIG. 1, when the polysilicon ground shield 63 and the P-type ground shield P60 overlap with each other in plan view of the SOI substrate SUB, the ratio of the magnetic flux passing through the pattern portion of the pattern ground shield PGS can be reduced by doubling the shield. Therefore, in order to weaken the magnetic field reaching the bulk layer 50 of the SOI substrate SUB as much as possible, it is desirable to multiplex the ground shield and form the pattern ground shield PGS so that the region immediately below the inductor is filled with any of the line-like patterns in plan view of the SOI substrate SUB without a gap.

[Q Value of Inductor]

Hereinafter, the effect of the pattern ground shield having the configuration described with reference to FIG. 1 will be described with reference to an equivalent circuit diagram from the viewpoint of improving the Q value of the inductor L.

Figure 7:
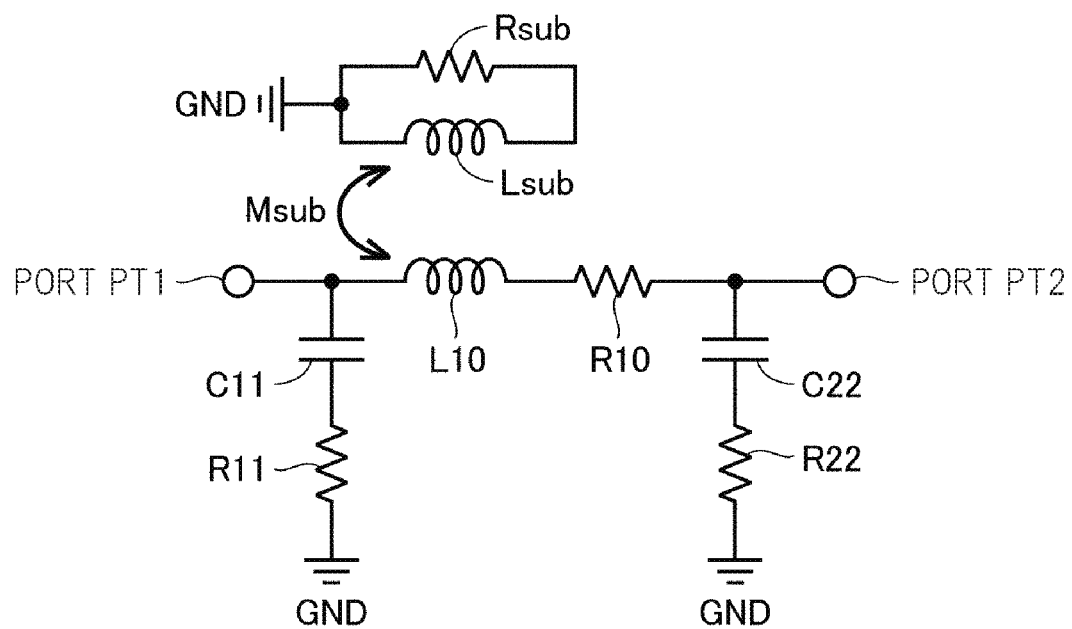
FIG. 7 is an equivalent circuit diagram of an inductor.

FIG. 7 is an equivalent circuit diagram of an inductor. Referring to FIG. 7, inductor L is represented by a n-type circuit model. The terminals at both ends of the inductor are referred to as ports PT1 and PT2. A high frequency inductor current flows from one of the ports PT1 and PT2 to the other.

Specifically, the self inductance of the inductor is L10, and the wiring resistance of the inductor L is R10. The parasitic capacitances of the inductors are represented by C11 and C22, and resistance values when a current flows through the parasitic capacitances C11 and C22 are denoted by R11 and R22, respectively. In addition, inductances when back electromotive currents (i.e., eddy currents) flow through the bulk layer 50 and the pattern ground shield PGS are denoted by Lsub and resistances are denoted by Rsub. The self-inductance L10 of the inductor and the inductance Lsub are coupled to each other by a mutual inductance Msub.

In the equivalent circuit of FIG. 7, the Q value refers to the ratio between the power consumed by the self inductance L10 and the power consumed by the other circuit elements. By providing the pattern ground shield PGS, the resistance values R11 and R22 can be reduced as compared with the case where the pattern ground shield PGS is not provided, so that the power consumption between the ports PT1 and PT2 and the ground GND can be reduced. As a result, the Q value can be improved.

Comparing flat shields that are not patterned with patterned ground shields, flat shields have a larger Lsub and smaller Rsub due to the larger current path of the back electromotive current (eddy current). As a result, since the back electromotive current is further increased, the self inductance L10 of the inductor becomes apparently small, and the Q value decreases. Therefore, the Q value of the inductor L can be increased in the case of the pattern ground shield.

Next, the case where the pattern ground shield PGS is formed in the metal wiring layer, the case where the pattern ground shield PGS is formed in the polysilicon ground shield above the BOX layer, and the case where the pattern ground shield PGS is formed in the impurity ground shield below the BOX layer are compared. When the pattern ground shield PGS is formed in the metal wiring layer, since C11 and C12 become larger, the self-resonance frequency of the inductor L becomes smaller and cannot be used in the high frequency region. When the pattern ground shield PGS is formed using the polysilicon layer above the BOX layer, the resistances R11 and R12 become relatively large, and therefore the power consumption between the ports PT1 and PT2 and the ground GND cannot be sufficiently reduced. When the pattern ground shield PGS is formed by using the impurity region below the BOX layer, C11 and C12 can be made smaller, and R11 and R12 can be reduced by increasing the impurity concentration, and as a result, the Q value can be increased.

Therefore, in the semiconductor device of the present embodiment, the pattern ground shield PGS is formed by using the impurity region under the BOX layer so that the semiconductor device can be used in the high frequency region and the Q value can be increased.

Further, by using the polysilicon ground shield 63 and the P-type ground shield P61 above the BOX layer in combination with the P-type ground shield P60 below the BOX layer, the magnetic field reaching the bulk layer 50 from the inductor L can be further weakened, so that the loss due to the eddy current flowing through the bulk layer 50 can be further reduced.

[Method of Manufacturing Semiconductor Device]

Next, a method of manufacturing the semiconductor device of the first embodiment will be described with reference to FIGS. 8 to 11.

Figure 8:
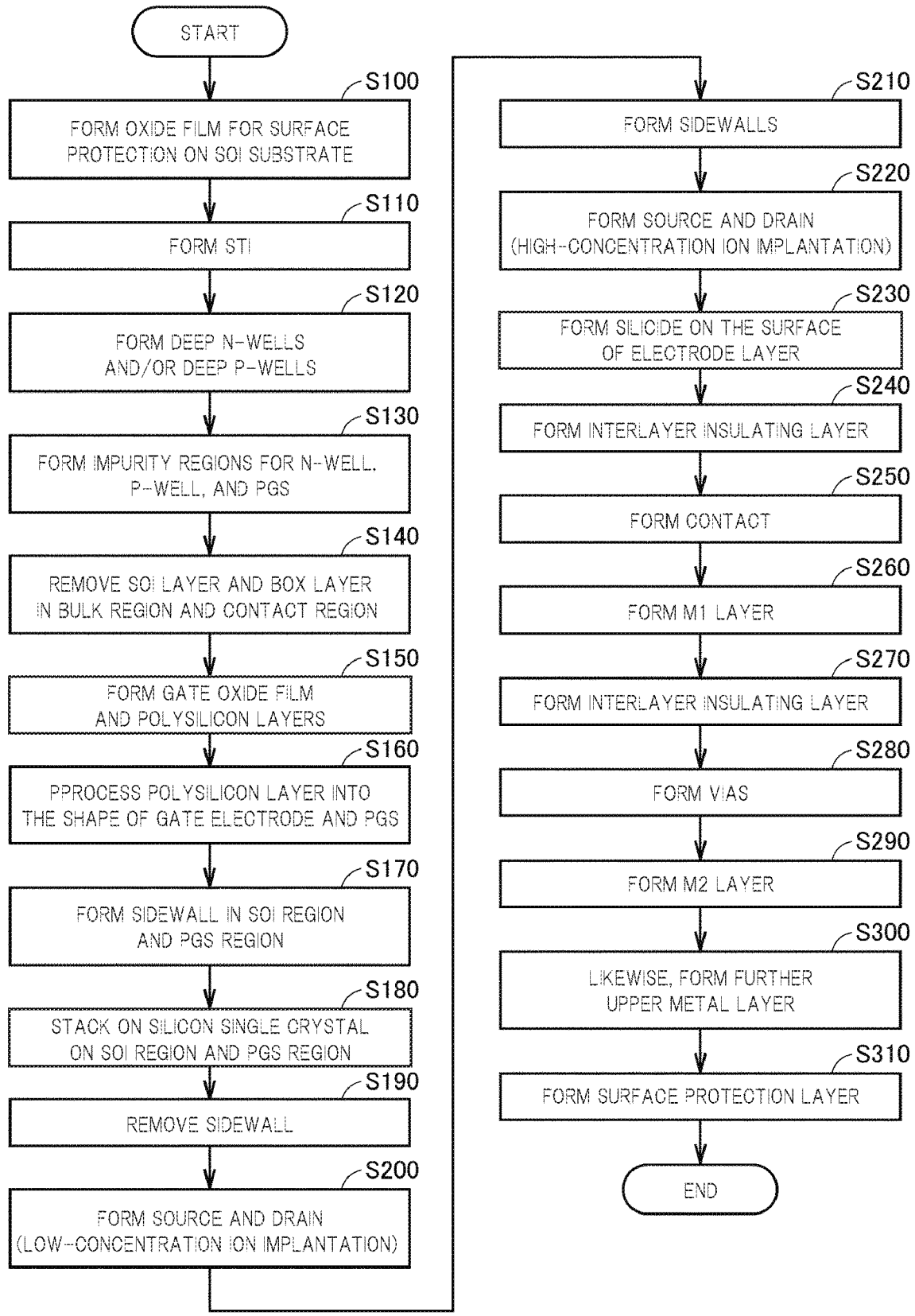
FIG. 8 is a flowchart showing an example of a method of manufacturing the semiconductor device according to the first embodiment.

FIG. 8 is a flowchart showing an example of a method of manufacturing the semiconductor device according to the first embodiment. FIG. 9 is a schematic cross-sectional view before the start of manufacturing of FIG. 8, after the end of step S110, and after the end of step S130. FIG. 10 is a schematic cross-sectional view after steps S160, S170, and S180 of FIG. 8 are completed. FIG. 11 is a schematic cross-sectional view after steps S200 and S220 of FIG. 8 are completed.

FIG. 9A is a cross-sectional view of an SOI substrate before processing. In the SOI substrate, a surface single crystal layer 58 is formed on a bulk layer 50 with a BOX layer 59 interposed therebetween. In the embodiment shown in FIG. 9A, the SOI substrate is divided into a region (SOI_Nch region) 80 in which a FDSOI type NMOS transistor is formed, a region (SOI_Pch region) 82 in which a FDSOI type PMOS transistor is formed, a region (Bulk region) 84 in which a bulk-type NMOS transistor is formed, and a region (PGS region) 85 in which a pattern ground shield PGS is formed.

Further, as shown in FIG. 9B, the SOI_Nch region 80 includes a region (PW contact region) 81 for forming a contact with the P-type well. The SOI_Pch region 82 includes an NW contact region 83 for forming a contact with the N-type well.

In step S100 of FIG. 8, first, an oxide film 78 for surface protection is formed on the SOI substrate.

In operation S110, a ST165 is formed at the boundaries of the SOI_Nch region 80, the SOI_Pch region 82, the Bulk region 84, and the PGS region 85. Further, in the SOI_Nch region 80, a ST165 is formed between the PW contact region 81 and another region. Similarly, in the SOI_Pch region 82, a ST165 is formed between the NW contact region 83 and another region.

As a method of forming the STI, a known method can be used. For example, after a groove for element isolation is formed by lithography and dry etching, the groove is filled with an oxide film. The unwanted oxide film is removed by chemical mechanical polishing (Chemical Mechanical Polishing).

The formation of the contact to the P-type ground shield P60 described with reference to FIG. 5 can be realized by applying the same process as that applied to the PW contact region 81.

Referring to FIG. 9C, in the next step S120, a deep N-type well and/or a deep P-type well are formed by ion implantation using a resist pattern as a mask. In FIG. 9C, a deep N-type well DNW1 is formed below the SOI_Nch area 80. The deep P-type well DPW1 used for supplying the grounding potential described with reference to FIG. 4 is also formed in operation S120.

In the next step S130, an N-well, a P-well, and an impurity region for the pattern ground shield PGS, i.e., the P-type ground shield P60, are formed by ion implantation using the resist pattern as a mask. Specifically, in the case of FIG. 9C, first, the N-type well NW1 of the SOI_Pch region 82 and the N-type well NW3 of the PGS region 85 are formed by ion implantation. Next, P-type impurity regions constituting the P-type well PW1 of the SOI_Nch region 80, the P-type well PW2 of the Bulk region 84, and the P-type ground shield P60 are formed.

Referring to FIG. 10A, in operation S140, the surface single crystal layer 58 and the BOX layer 59 in the Bulk region 84, the PW contact region 81, and the NW contact region 83 are removed.

In the next step S150, a gate oxide film is formed on the entire surface of the wafer. Further, a polysilicon layer used for the gate electrode G and the polysilicon ground shield 63 is formed on the entire surface of the wafer. A protective film 90 of silicon nitride is formed on the surface of the generated polysilicon layer.

In the next step S160, the generated polysilicon layer is processed into the shape of the gate electrode G and the shape of the polysilicon ground shield 63 by lithography and dry etching.

Referring to FIG. 10B, in step S170, a silicon oxide film is deposited on the entire surface of the wafer and then etched back to form sidewalls 91 on the sidewalls of the gate electrode G and the sidewalls of the polysilicon ground shield 63. However, in the Bulk regions 84, the silicon oxide film is left as it is without being etched back by masking the silicon oxide film with a resist.

Referring to FIG. 10C, in the next step S180, a silicon single crystal is stacked on each of the surface single crystal layer 58 of the SOI_Nch region 80, the surface single crystal layer 58 of the SOI_Pch region 82, the surface single crystal layer 58 of the PGS region 85, the PW contact region 81, and the NW contact region 83. At this time, silicon single crystals do not grow on the surfaces of the sidewalls 91 and on the surfaces of the silicon oxide films formed in the Bulk regions 84. A protective film 92 of silicon nitride or the like is formed on the surface of the stacked silicon single crystal.

Referring to FIG. 11A, in operation S190, the silicon oxide films of the sidewalls 91 and the Bulk regions 84 are removed.

In step S200, low-concentration N-type impurities are ion-implanted into the source S and drain D regions of the SOI_Nch region 80, the impurity region 93 of the NW contact region 83, and the source S and drain D regions of the Bulk region 84 using the resist patterned by the lithography process as a mask. Similarly, using the resist patterned by the lithography process as a mask, low concentration P-type impurities are ion-implanted into the surface single crystal layer 58 around the source S and drain D regions of the SOI_Pch region 82, the impurity region 94 of the PW contact region 81, and the polysilicon ground shield 63 of the PGS region 85.

Referring to FIG. 11B, in step S210, a sidewall 64 is formed on the sidewall of the gate electrode G of the SOI_Nch region 80, the sidewall of the gate electrode G of the SOI_Pch region 82, the sidewall of the gate electrode G of the Bulk region 84, and the sidewall of the polysilicon ground shield 63 of the PGS region 85.

In the next step S220, the protective film 92 is removed. Thereafter, high-concentration N-type impurities are ion-implanted into the source S and drain D regions of the SOI_Nch region 80, the impurity region 93 of the NW contact region 83, and the source S and drain D regions of the Bulk region 84. In this case, it is not injected below the sidewall 64. Similarly, high concentration P-type impurities are implanted into the surface single crystal layer 58 around the source S and drain D regions of the SOI_Pch region 82, the impurity region 94 of the PW contact region 81, and the polysilicon ground shield 63 of the PGS region 85. In this case, it is not injected below the sidewall 64.

Referring to FIGS. 1, 4, 5, and 6, in the next step S230, silicide is formed on the gate electrode G, the source S, and the drain D. Thereafter, the interlayer insulating layer 51 is formed (step S240), the contact CT is formed in the interlayer insulating layer 51 (step S250), and the metal wiring layer M1 is formed on the surface of the interlayer insulating layer 51 (step S260).

After the metal wiring layer M1 is patterned, an interlayer insulating layer 52 is formed (step S270), vias are formed in the interlayer insulating layer 52 (step S280), and a metal wiring layer M2 is formed on the surface of the interlayer insulating layer 52 (step S290).

After the metal wiring layer M2 is patterned, the interlayer insulating layers 53, 54, and 55 and the metal wiring layers M3, M4, and M5 of the upper layer are formed in the same manner. The metal wiring layers M3, M4, and M5 are also subjected to necessary patterning in step S300. In the present embodiment, the inductor L is formed mainly using the metal wiring layer M5.

After the patterning of the metal wiring layer M5, the surface protection layers 56 and 57 are formed on the surface of the wafer in step S310. Thus, the semiconductor devices 100, 100A, 100B, and 100C shown in FIGS. 1, 4, 5, and 6 are completed.

Effects of the First Embodiment

As described above, the semiconductor device of the first embodiment is characterized in that the pattern ground shield is formed by the P-type ground shield P60 provided below the BOX layer 59 and the polysilicon ground shield 63 and the P-type ground shield P61 provided above the BOX layer 59. In particular, since the P-type ground shield P60 is farther away from the inductor L than the polysilicon ground shield 63, the coupling capacitance with the inductor L is not increased. Further, since the conductivity of the P-type ground shield P60 can be increased more than that of the polysilicon ground shield 63 by increasing the impurity concentration, the loss can be reduced. In addition, by using the polysilicon ground shield 63 and the P-type ground shield P60 in combination, the magnetic field reaching the bulk layer 50 from the inductor L can be further weakened, so that the loss due to the eddy current flowing through the bulk layer 50 can be further reduced.

The pattern ground shield PGS can be formed using the same processes as those of the FDSOI type PMOS transistor PM1. Therefore, there is an advantage that a special process for forming the pattern ground shield PGS is not required.

Second Embodiment

In the second embodiment, a case where the N-type ground shield N60 is formed as the pattern ground shield PGS using the N-type impurity region instead of the P-type ground shield P60 will be described.

[Structure of Semiconductor Device]

Figure 12:
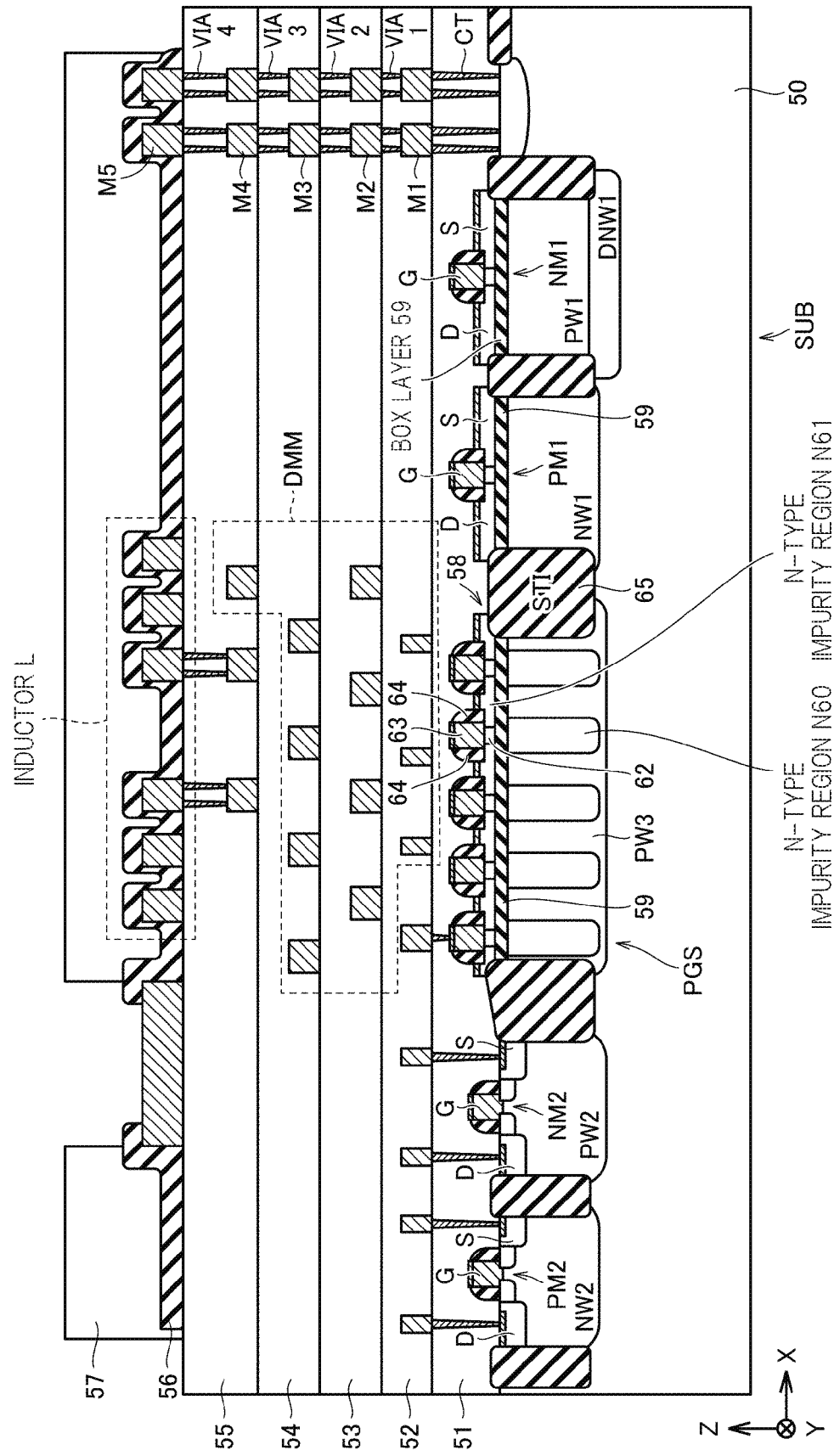
FIG. 12 is a cross-sectional view showing the configuration of the semiconductor device of the second embodiment.

FIG. 12 is a cross-sectional view showing the configuration of the semiconductor device of the second embodiment. The semiconductor device 100D of the second embodiment shown in FIG. 12 differs from the semiconductor devices 100, 100A to 100C of the first embodiment shown in FIG. 1 and the like in that an N-type ground shield N60 is used instead of the P-type ground shield P60 as the pattern ground shield PGS below the BOX layer 59. The N-type ground shield N60 is formed inside the P-type well PW3 formed in the bulk layer 50.

The semiconductor device 100D of FIG. 12 differs from the semiconductor devices 100, 100A to 100C of the first embodiment shown in FIG. 1 and the like in that an N-type ground shield N61 using an N-type impurity region is used as the pattern ground shield PGS above the BOX layer 59 in place of the P-type ground shield P61.

Since the other points in FIG. 12 are the same as those in FIG. 1, the same or corresponding portions are denoted by the same reference numerals, and description thereof will not be repeated.

Similar to the description in FIG. 4, in order to supply the power supply potential as the fixed potential to the N-type ground shield N60, a deep N-type well for connecting the lower portion of the N-type ground shield N60 and the N-type well of the N-type contact region may be provided. In this case, the power supply potential is supplied from the power supply wiring formed in the metal wiring layer M1 to the N-type contact region via the contact CT. A power supply potential is supplied from the N-type contact region to the N-type ground shield N60 through the deep N-type well.

Similar to the description in FIG. 5, in order to supply the power supply potential to the N-type ground shield N60, an exposed portion in which the upper portion of the N-type ground shield N60 is exposed may be formed by removing a part of the surface single crystal layer 58 and the BOX layer 59 provided above the N-type ground shield N60. The silicide formed on the surface of the exposed portion and the power supply wiring formed using the metal wiring layer M1 may be connected via the contact CT. In this case, the power supply potential can be supplied from the power supply wiring formed in the metal wiring layer M1 to the N-type ground shield N60 via the contact CT.

In addition, similarly to the description in FIG. 6, the shape and arrangement of the N-type ground shield N60 provided below the BOX layer 59 can be different from the shape and arrangement of the polysilicon ground shield 63 provided above the BOX layer 59 when viewed from the direction perpendicular to the SOI substrate SUB.

[Method of Manufacturing Semiconductor Device]

The manufacturing method of the semiconductor device 100D of FIG. 12 is the same as the manufacturing method of the semiconductor device 100 of the first embodiment described with reference to FIGS. 8 to 11 except that the conductivity types of the constituent materials of the PGS region 85 are reversed.

Specifically, in step S130, in order to form the N-type ground shield N60, an N-type impurity region is formed below the BOX layer 59 by ion implantation using a resist pattern as a mask.

In steps S200 and S220, in order to form the N-type ground shield N61, an N-type impurity region is formed in the surface single crystal layer 58 above the BOX layer 59 by ion implantation using a resist pattern as a mask.

Other points in FIGS. 8 to 11 can be applied to the manufacturing process of the semiconductor device 100D of the second embodiment in the same manner, and therefore description thereof will not be repeated.

Effects of the Second Embodiment

The semiconductor device 100D having the above configuration also exhibits the same effects as those of the semiconductor devices 100, 100A to 100C of the first embodiment. That is, by forming the pattern ground shield using the N-type ground shield N60, it is possible to reduce the loss in the pattern ground shield without increasing the coupling capacitance with the inductor L. Further, by using the polysilicon ground shield 63 and the N-type ground shield N60 in combination, the magnetic field reaching the bulk layer 50 from the inductor L can be further weakened, so that the loss due to the eddy current flowing through the bulk layer 50 can be further reduced.

Further, the above-mentioned pattern ground shield PGS can be formed using the same process as that of the FDSOI type NMOS transistor NM1, and there is a merit that a particular process is not required.

Third Embodiment

In the third embodiment, a case where the P-type well PW3 surrounding the N-type ground shield N60 is not provided in the configuration of the semiconductor device 100D of the second embodiment will be described.

[Structure of Semiconductor Device]

Figure 13:
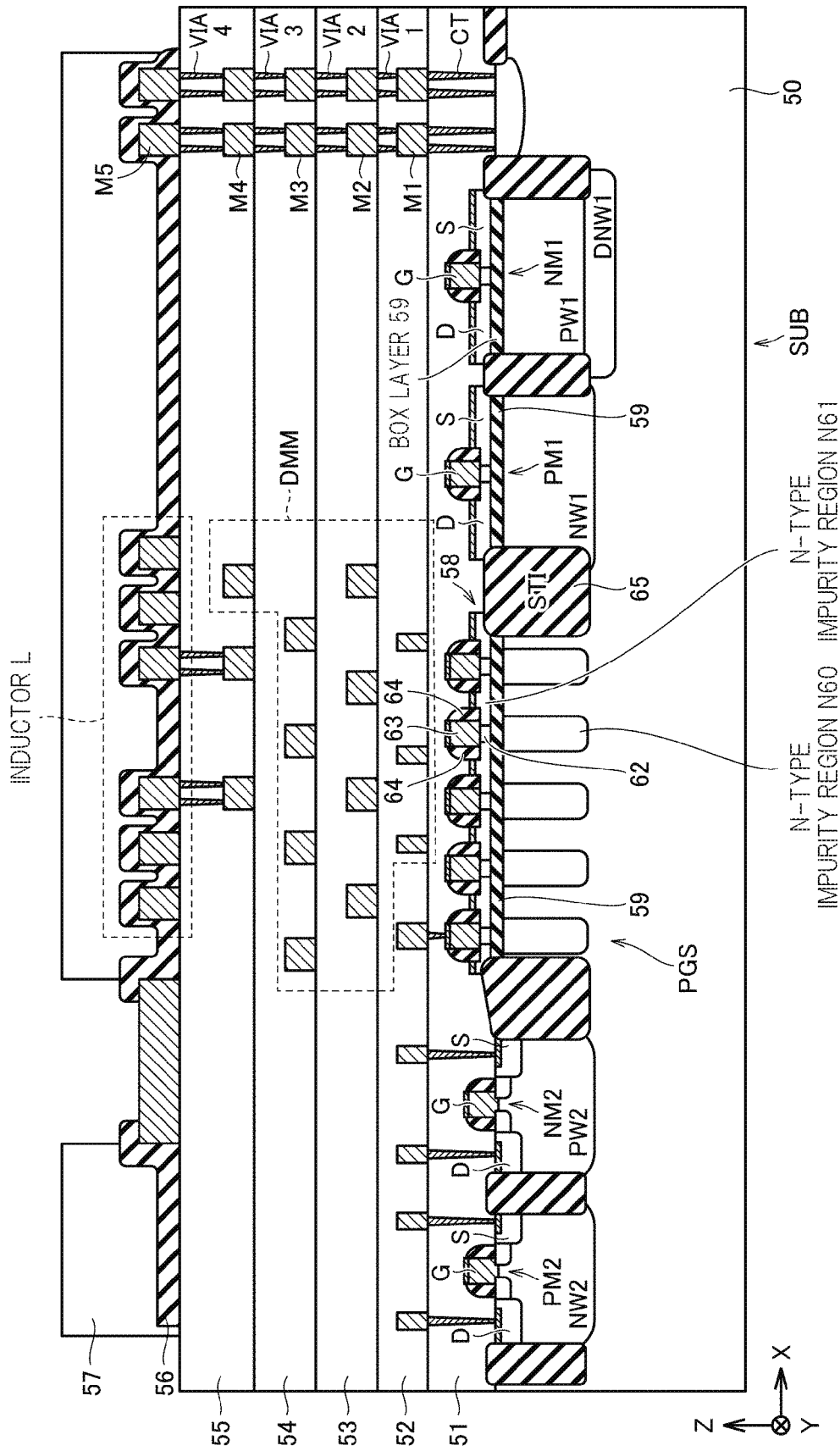
FIG. 13 is a cross-sectional view showing the configuration of the semiconductor device of the third embodiment.

FIG. 13 is a cross-sectional view showing the configuration of the semiconductor device of the third embodiment. The semiconductor device 100E of FIG. 13 differs from the semiconductor device 100D of FIG. 12 in that the P-type well PW3 surrounding the N-type ground shield N60 is not provided. In this case, the bulk layer 50 which is a P-type semiconductor is provided instead of the P-type well PW3. Since the other points in FIG. 13 are the same as those in FIG. 12, the same or corresponding portions are denoted by the same reference numerals, and description thereof will not be repeated.

[Method of Manufacturing Semiconductor Device]

The manufacturing method of the semiconductor device 100E of FIG. 13 is the same as the manufacturing method of the semiconductor device 100 of the first embodiment described with reference to FIGS. 8 to 11 except that the conductivity type of the constituent material of the PGS region 85 is reversed and that a well is not formed around the impurity region under the BOX layer 59 constituting the pattern ground shield PGS.

Specifically, in S130, the P-type well for the bulk-type NMOS transistor and the P-type well for the FDSOI type NMOS transistor are formed by ion implantation, but the P-type well is not formed in the area where the pattern ground shield PGS is formed. In operation S130, the N-type well for the bulk-type PMOS transistor PM2, the N-type well for the FDSOI type PMOS transistor PM2, and the N-type impurity regions as the N-type ground shields N60 are formed under the BOX layers 59 by ion implantation.

In steps S200 and S220, in order to form the N-type ground shield N61, an N-type impurity region is formed in the surface single crystal layer 58 above the BOX layer 59 by ion implantation using a resist pattern as a mask.

Other points in FIGS. 8 to 11 can be applied to the manufacturing process of the semiconductor device 100E of the third embodiment in the same manner, and therefore description thereof will not be repeated.

Effects of the Third Embodiment

The resistivity of the bulk layer 50 is larger than the resistivity of the P-type well PW3 in FIG. 12. As a result, the power consumed in the bulk layer 50 immediately below the inductor L in FIG. 13 becomes smaller than the power consumed in the P-type well PW3 in FIG. 12, and as a result, the Q value of the inductor L can be increased. Other effects of the semiconductor device 100E of FIG. 13 are the same as those of the semiconductor device 100D described with reference to FIG. 12.

Fourth Embodiment

In the fourth embodiment, a description will be given of a case where the P-type ground shield P60 constituting the pattern ground shield or the N-type ground shield N60 is formed in a step different from the step of forming the P-type well or the N-type well NW. As a result, the thickness of the P-type ground shield P60 or the N-type ground shield N60 along the direction perpendicular to the main surface of the SOI substrate SUB can be made thinner than the thickness of the P-type well or the N-type well NW along the direction perpendicular to the main surface of the SOI substrate SUB. Further, the impurity concentration of the P-type ground shield P60 or the N-type ground shield N60 can be made higher than the impurity concentration of the P-type well or the N-type well.

Hereinafter, configurations of the semiconductor devices 100F, 100G, and 100H as modification examples of the semiconductor devices 100, 100D, and 100E of the first to third embodiments will be described with reference to FIGS. 14 to 16, respectively.

[Structure of Semiconductor Device (1)]

Figure 14:
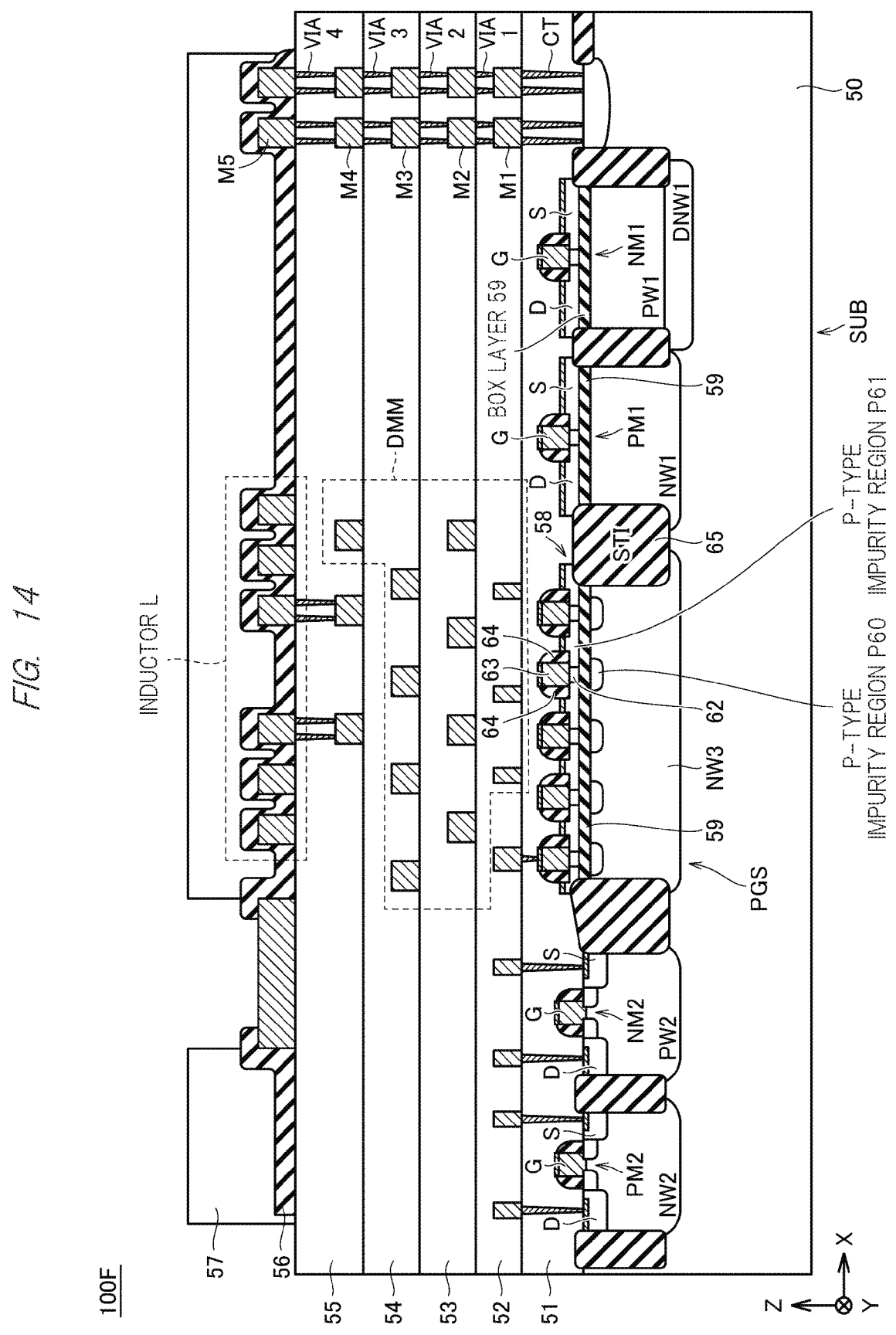

FIG. 14 is a cross-sectional view showing the configuration of the semiconductor device of the fourth embodiment. The semiconductor device 100F of FIG. 14 is a modification of the semiconductor device 100 of the first embodiment shown in FIG. 1.

Specifically, in the case of the semiconductor device 100 of the first embodiment shown in FIG. 1, the P-type ground shield P60 that constitutes the pattern ground shield PGS was formed in the same process as the P-type wells PW1 and PW2 (step S130 of FIG. 8). Therefore, the thickness and impurity concentration of the P-type ground shield P60 in the SOI substrate vertical direction are equal to the thickness and impurity concentration of the P-type wells PW1 and PW2 in the SOI substrate vertical direction.

In contrast, in the semiconductor device 100F of FIG. 14, the P-type impurity regions constituting the P-type ground shield P60 provided below the BOX layer 59 are formed in a process different from the P-type wells PW1 and PW2. That is, the ion implantation process in step S130 of FIG. 8 is divided into a process of forming the N-type wells NW1, NW2, and NW3, a process of forming the P-type wells PW1 and PW2, and a process of forming the P-type impurity region constituting the P-type ground shield P60. As a result, the thickness of the P-type ground shield P60 in the SOI substrate vertical direction can be made thinner than the thickness of the P-type wells PW1 and PW2 in the SOI substrate vertical direction, and the impurity concentration of the P-type ground shield P60 can be made higher than the impurity concentration of the P-type wells PW1 and PW2.

According to the above configuration, the coupling capacitance between the line-like patterns constituting the P-type ground shield P60 can be reduced, and the loss in the pattern ground shield PGS and the bulk layer 50 can be reduced. As a result, the Q value of the inductor L can be further increased.

[Structure of Semiconductor Device (2)]

Figure 15:
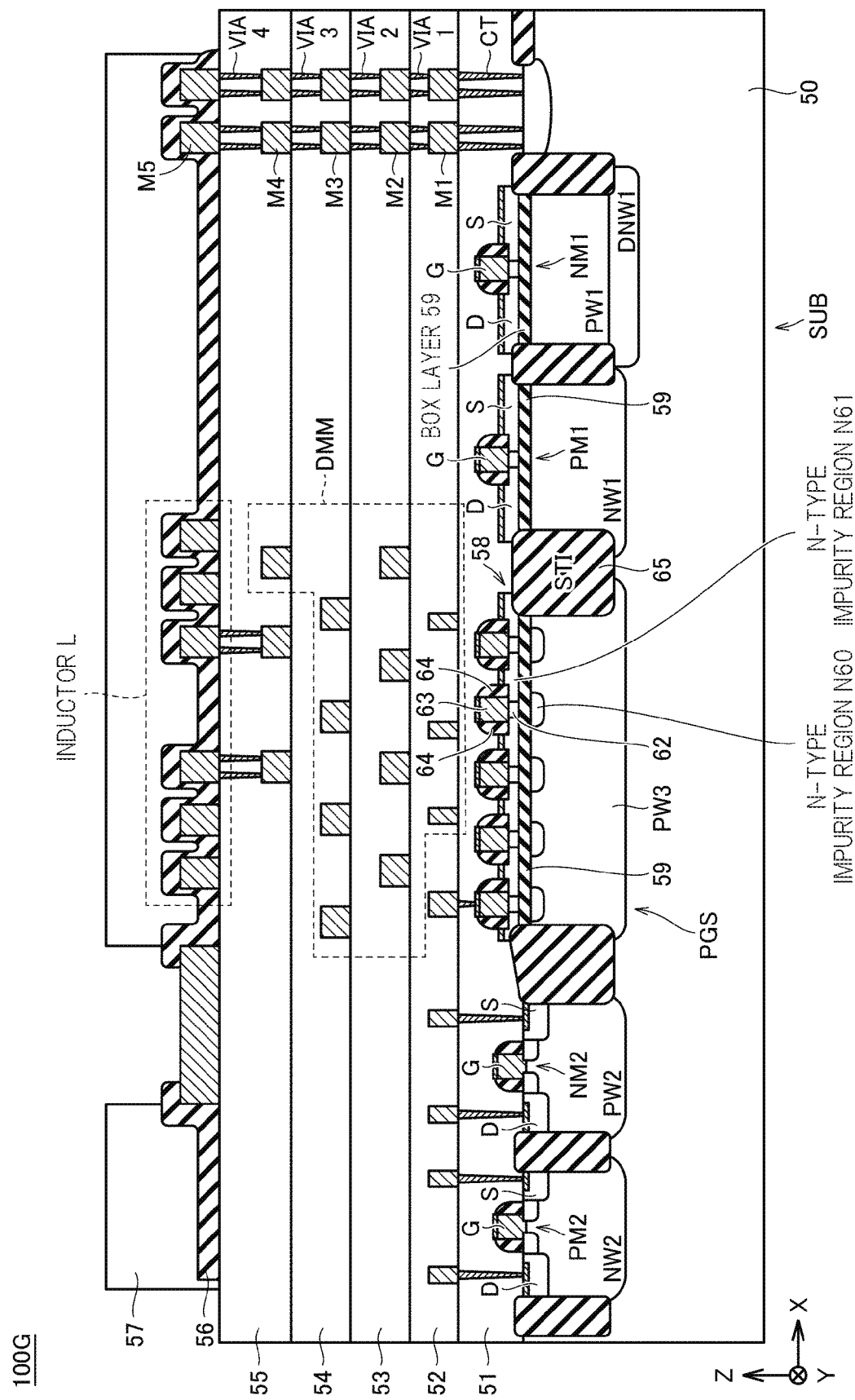
FIG. 15 is a cross-sectional view showing a configuration of a semiconductor device according to a first modification of the fourth embodiment.

FIG. 15 is a cross-sectional view showing a configuration of a semiconductor device according to a first modification of the fourth embodiment. The semiconductor device 100G of FIG. 15 is a modification of the semiconductor device 100D of the second embodiment shown in FIG. 12.

Specifically, in the case of the semiconductor device 100D of the second embodiment shown in FIG. 12, the N-type ground shield N60 constituting the pattern ground shield PGS is formed in the same process as the N-type wells NW1 and NW2. For this reason, the thickness and the impurity concentration of the N-type ground shield N60 in the SOI substrate vertical direction are equal to the thickness and the impurity concentration of the N-type wells NW1 and NW2 in the SOI substrate vertical direction.

On the other hand, in the semiconductor device 100G of FIG. 15, the N-type impurity region constituting the N-type ground shield N60 provided below the BOX layer 59 is formed in a process different from that of the N-type wells NW1 and NW2. As a result, the thickness of the N-type ground shield N60 in the vertical direction of the SOI substrate can be made thinner than the thickness of the N-type wells NW1 and NW2 in the vertical direction of the SOI substrate, and the impurity concentration of the N-type ground shield N60 can be made higher than the impurity concentration of the N-type wells NW1 and NW2.

According to the above configuration, the coupling capacitance between the line-like patterns constituting the pattern ground shield can be reduced, and the loss in the pattern ground shield PGS and the bulk layer 50 can be reduced. As a result, the Q value of the inductor L can be further increased.

[Structure of Semiconductor Device (3)]

Figure 16:
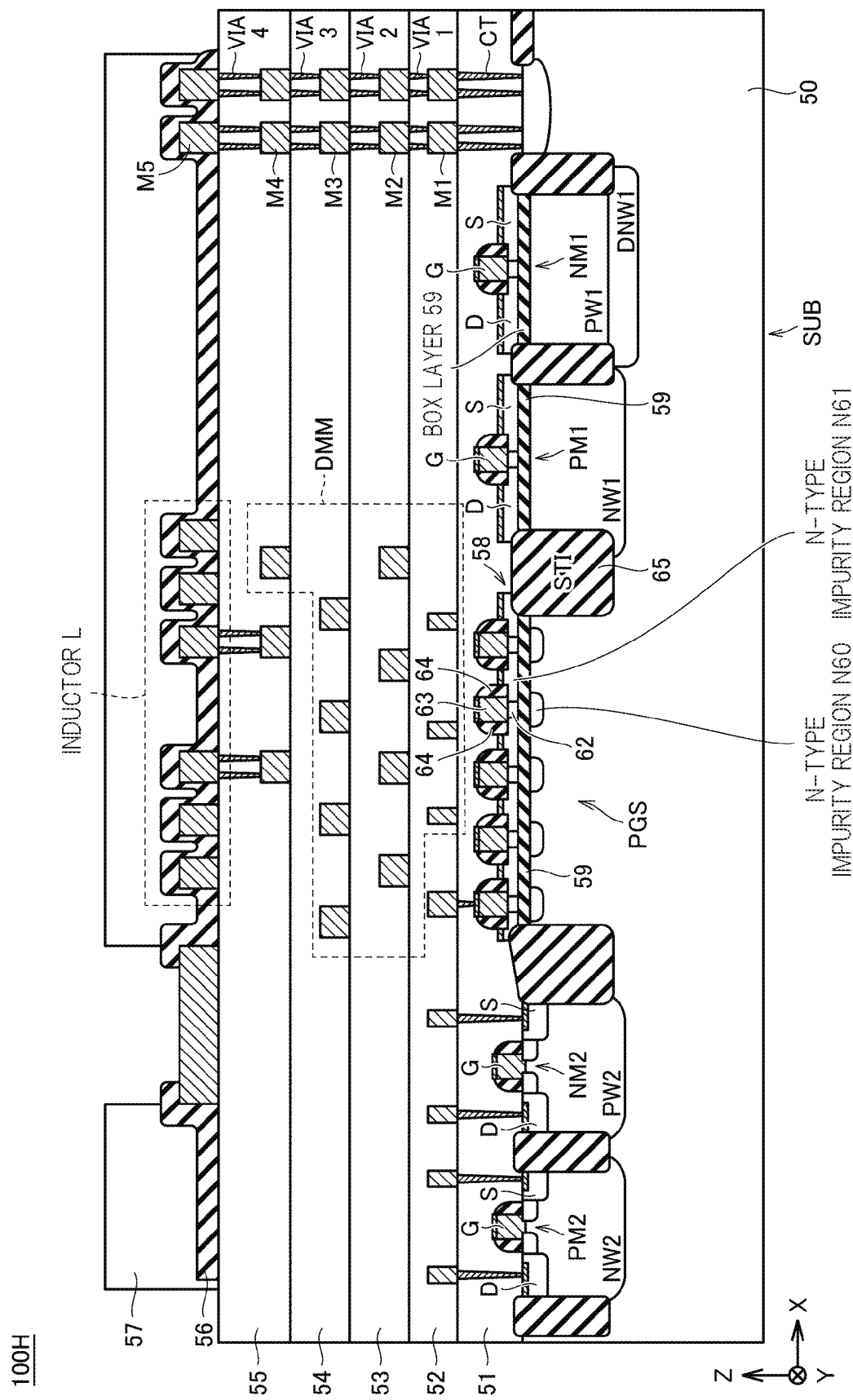
FIG. 16 is a cross-sectional view showing a configuration of a semiconductor device according to a second modification of the fourth embodiment.

FIG. 16 is a cross-sectional view showing a configuration of a semiconductor device according to a second modification of the fourth embodiment. The semiconductor device 100H of FIG. 16 is a modification of the semiconductor device 100E of the third embodiment shown in FIG. 13.

Specifically, in the case of the semiconductor device 100E of the third embodiment shown in FIG. 13, the N-type ground shield N60 constituting the pattern ground shield PGS is formed in the same process as the N-type wells NW1 and NW2. For this reason, the thickness and the impurity concentration of the N-type ground shield N60 in the SOI substrate vertical direction are equal to the thickness and the impurity concentration of the N-type wells NW1 and NW2 in the SOI substrate vertical direction.

On the other hand, in the semiconductor device 100H of FIG. 16, the N-type impurity region constituting the N-type ground shield N60 provided below the BOX layer 59 is formed in a process different from that of the N-type wells NW1 and NW2. As a result, the thickness of the N-type ground shield N60 in the vertical direction of the SOI substrate can be made thinner than the thickness of the N-type wells NW1 and NW2 in the vertical direction of the SOI substrate, and the impurity concentration of the N-type ground shield N60 can be made higher than the impurity concentration of the N-type wells NW1 and NW2.

According to the above configuration, the coupling capacitance between the line-like patterns constituting the N-type ground shield N60 can be reduced, and the loss in the pattern ground shield PGS and the bulk layer 50 can be further reduced. As a result, the Q value of the inductor L can be further increased.

Effects of the Fourth Embodiment

As described above, in the semiconductor devices 100F, 100G, and 100H of the fourth embodiment, the impurity ground shields P60 and N60 formed under the BOX layers 59 are formed in the steps different from the steps of forming the wells for the FDSOI MOS transistors and the steps of forming the wells of the bulk-type MOS transistors. As a result, the thickness of the impurity region in the vertical direction of the SOI substrate under the BOX layer used as the pattern ground shield PGS can be made thinner, and the impurity concentration can be further increased. Therefore, the coupling capacitance between the line-like patterns constituting the pattern ground shield can be reduced, and the loss in the pattern ground shield PGS and the bulk layer 50 can be further reduced. As a result, the Q value of the inductor L can be further increased.

In the manufacturing process of the semiconductor device, for example, in step S130 of FIG. 8, since the step of forming the impurity region for the pattern ground shield PGS (i.e., the step of forming a resist mask, ion implantation, and resist removal) is only a separate step, there is no significant change in the manufacturing process. Thus, there is little increase in manufacturing costs.

Fifth Embodiment

In the semiconductor devices 100, 100A-100H of the first to fourth embodiments, the pattern ground shield PGS consisted of an impurity region below the BOX layer, a polysilicon layer on the BOX layer (corresponding to the gate electrode G) and an impurity region (corresponding to the source S and drain D) by basically utilizing the SOI structure. In the semiconductor device 100I of the fifth embodiment, in the pattern ground shield PGS, a structure using a BOX layer similar to that of the first to fourth embodiments and a structure similar to that of a bulk MOS transistor not using a BOX layer are alternately arranged. Hereinafter, the fifth embodiment will be specifically described with reference to the drawings.

[Structure of Semiconductor Device]

Figure 17:
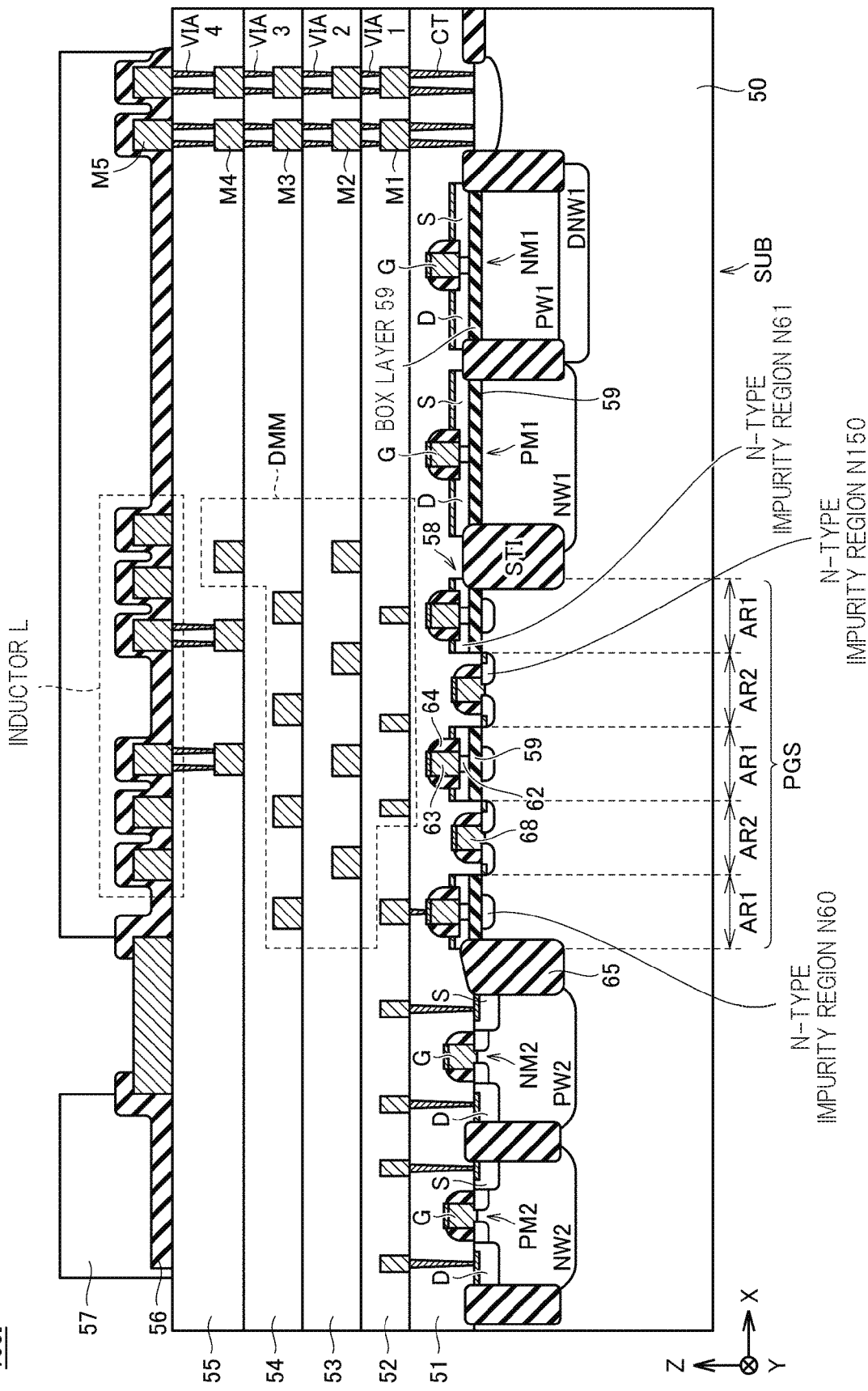
FIG. 17 is a cross-sectional view showing the configuration of the semiconductor device of the fifth embodiment.

FIG. 17 is a cross-sectional view showing the configuration of the semiconductor device of the fifth embodiment.

Referring to FIG. 17, a region where the pattern ground shield PGS is formed is divided into a plurality of SOI regions AR1 having a BOX layer 59 and a plurality of bulk regions AR2 from which the BOX layer 59 is removed. The SOI regions AR1 and the bulk regions AR2 are alternately arranged in the X direction and extend in the Y direction.

The structure of the pattern ground shield PGS in each SOI region AR1 is similar to that of the semiconductor devices 100, 100A to 100H of the first to fourth embodiments. That is, a structure similar to a structure of one FDSOI type NMOS transistor is formed on the BOX layer 59, and an N-type ground shield N60 is formed below the BOX layer 59.

More specifically, on the BOX layer 59, two N-type impurity regions corresponding to the source S and the drain D, i.e., the N-type ground shield N61, face each other in the X direction with the semiconductor layer 62 interposed therebetween. A polysilicon ground shield 63 extending in the Y direction is formed on the semiconductor layer 62 and the N-type ground shield N61 with a gate insulating film (not shown) interposed therebetween. Sidewalls 64 are formed on the sidewalls in the ±X direction with respect to the polysilicon ground shield 63. An N-type ground shield N60 extending in the Y direction is formed below the BOX layer 59.

On the other hand, the structure of the pattern ground shield PGS in the bulk regions AR2 is the same as the structure of one bulk type NMOS transistor NM2. Specifically, an N-type ground shield N150, which is an N-type impurity region corresponding to the source S and the drain D, is formed on the bulk layer 50 so as to face each other in the X direction. A polysilicon ground shield 68 extending in the Y direction corresponding to the gate electrode G is formed on the bulk layer 50 and the N-type ground shield N150 with a gate oxide film (not shown) interposed therebetween. Sidewalls 64 are formed on the sidewalls of the polysilicon ground shield 68 in the ±X direction. In plan view of the SOI substrate SUB, the N-type ground shield N150 corresponding to the source S and the drain D is disposed adjacent to the polysilicon ground shield 68 corresponding to the gate electrode G.

Here, as in the fourth embodiment, the thickness of the N-type ground shield N60 formed in the SOI area AR1 in the SOI substrate vertical direction is formed to be thinner than the thickness of the N-type well NW in which the FDSOI type NMOS transistor NM1 is formed in the SOI substrate vertical direction. As a result, the parasitic capacitance between the N-type ground shield N60 and the N-type ground shield N150 in the adjacent bulk region AR2 can be further reduced, so that the eddy current flowing to the pattern ground shield PGS via the parasitic capacitance can be suppressed.

[Method of Manufacturing Semiconductor Device]

Figure 18:
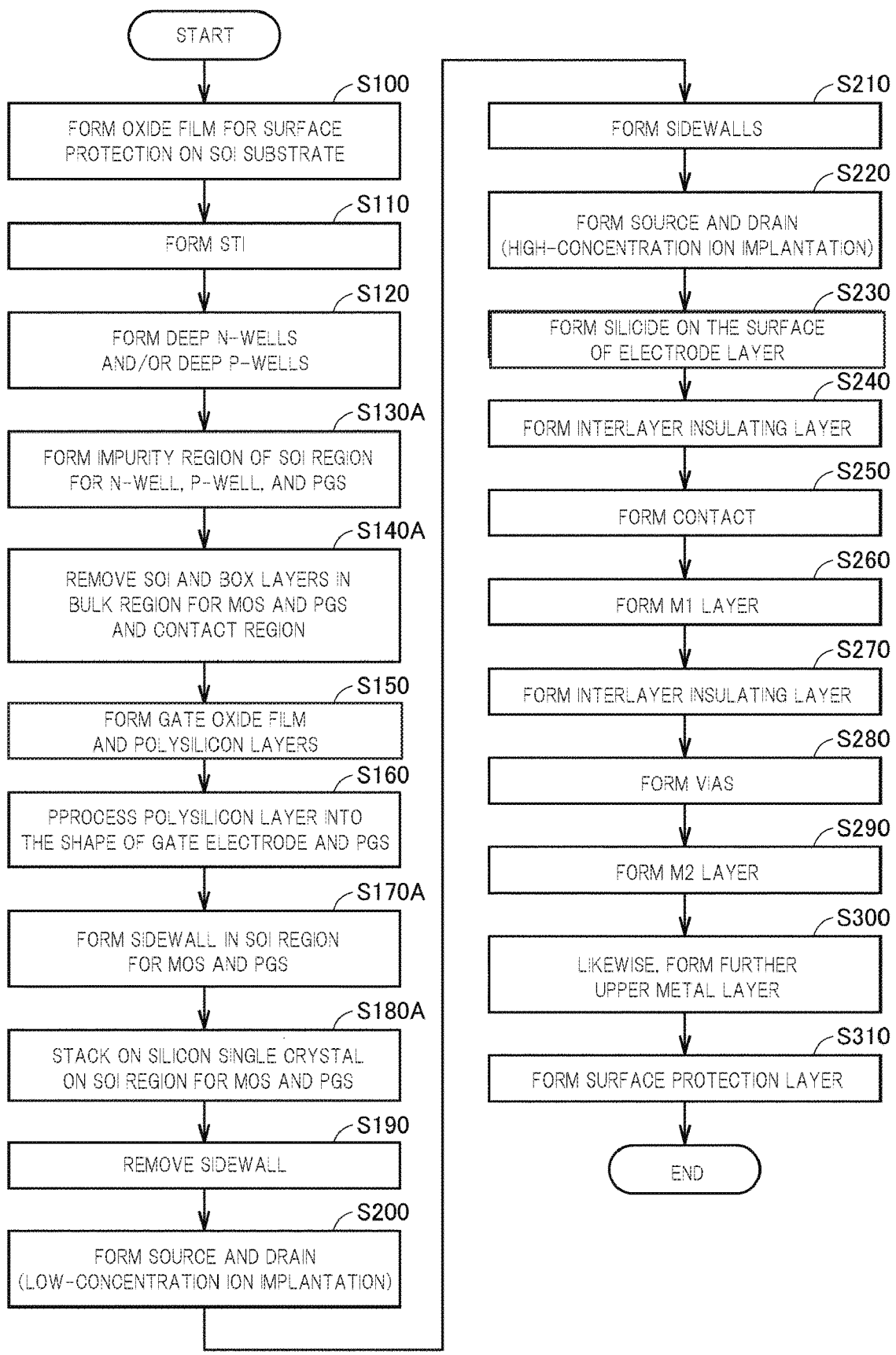
FIG. 18 is a flowchart showing an example of a method of manufacturing a semiconductor device of the fifth embodiment shown in FIG. 17.

FIG. 18 is a flowchart showing an example of a method of manufacturing a semiconductor device of the fifth embodiment shown in FIG. 17. The flowchart of FIG. 18 is similar to the manufacturing method of the semiconductor device 100 of the first embodiment shown in FIG. 8. Accordingly, the same or corresponding steps will be denoted by the same reference numerals, and the description will not be repeated or will be briefly described.

Referring to FIGS. 17 and 18, in step S100, an oxide film for surface protection is formed on the SOI substrate. In the next step S110, an STI for element isolation is formed. In the next step S120, a deep N-type well and/or a deep P-type well are formed by ion implantation using a resist pattern as a mask.

In S130A, P-type wells PW1 and PW2 for the FDSOI type NMOS transistor NM1 and the bulk-type NMOS transistor NM2 of FIG. 17 are formed by ion implantation. Further, N-type wells NW1 and NW2 for the FDSOI type PMOS transistor PM1 and the bulk-type PMOS transistor PM2 are formed by ion implantation.

Further, in the SOI region AR1 for the pattern ground shield PGS, an N-type impurity region constituting the N-type ground shield N60 is formed by ion implantation. Here, in the case of the pattern ground shield PGS of the SOI region AR1 of FIG. 17, as in the case of FIG. 16, the N-type ground shield N60 is formed directly on the bulk layer 50 below the BOX layer 59 without providing the P-type well.

In S140A, the surface single crystal layer 58 and the BOX layer 59 are removed in the bulk region where the bulk type PMOS transistor PM2 and the bulk type NMOS transistor NM2 are formed and in the bulk region AR2 for the pattern ground shield PGS.

In the next step S150, a gate oxide film is formed on the entire surface of the wafer. Further, a polysilicon layer used for the gate electrode G and the polysilicon ground shields 63 and 68 is formed on the entire surface of the wafer. A protective film of silicon nitride is formed on the surface of the generated polysilicon layer.

In the next step S160, the generated polysilicon layer is processed into the shape of the gate electrode G and the shape of the polysilicon ground shields 63 and 68 by lithography and dry etching.

In the next step S170A, a silicon oxide film is deposited on the entire surface of the wafer, and then etching back is performed to form the sidewalls 64 on the sidewalls of the gate electrode G and the sidewalls of the polysilicon ground shields 63 and 68. However, in the bulk region in which the bulk type PMOS transistor PM2 and the bulk type NMOS transistor NM2 are formed, and in the bulk region AR2 for the pattern ground shield PGS, etching back is not performed by masking with a resist.

Next, in S180A, in the region where the FDSOI type PMOS transistor PM1 and the FDSOI type NMOS transistor NM1 are formed, and in the SOI region AR1 for the pattern ground shield PGS, silicon single crystal is stacked on the upper portion of the surface single crystal layer 58. At this time, the silicon single crystal does not grow on the surface of the sidewall 64 and in the bulk region covered with the silicon oxide film. A protective film such as silicon nitride is formed on the surface of the stacked silicon single crystal.

Next, in step S190, the silicon oxide film covering the sidewall 64 and the bulk region is removed.

In S200, a low-concentration N-type impurity is implanted into the source S and drain D regions of the FDSOI type NMOS transistor NM1 and the source S and drain D regions of the bulk-type NMOS transistor NM2. The low concentration N-type impurity is further implanted into the surface single crystal layer 58 around the polysilicon ground shield 63 in the SOI region AR1 for the pattern ground shield PGS, and into the bulk layer 50 around the polysilicon ground shield 68 in the bulk region AR2. Similarly, a low-concentration P-type impurity is implanted into the source S and drain D regions of the FDSOI type PMOS transistor PM1 and the source S and drain D regions of the bulk-type PMOS transistor PM2.

In the next step S210, sidewalls 64 are formed on the sidewalls of the gate electrode G and the sidewalls of the polysilicon ground shields 63 and 68.

In the next step S220, the protective film on the piled-up surface single crystal layer 58 is removed. Thereafter, a high-concentration N-type impurity is implanted into the source S and drain D regions of the FDSOI type NMOS transistor NM1 and the source S and drain D regions of the bulk-type NMOS transistor NM 2.

The high-concentration N-type impurity is further implanted into the surface single crystal layer 58 in the portion other than the portion around the polysilicon ground shield 63 and under the sidewall 64 in the SOI region AR1 for the pattern ground shield PGS. As a result, the N-type ground shield N61 is formed. The high-concentration N-type impurity is further implanted into the bulk layer 50 in the bulk region AR2 in a portion around the polysilicon ground shield 68 and excluding the portion below the sidewall 64. As a result, the N-type ground shield N150 is formed.

Similarly, a high-concentration P-type impurity is implanted into the source S and drain D regions of the FDSOI type NMOS transistor NM1 and the source S and drain D regions of the bulk-type NMOS transistor NM2. In this case, it is not injected below the sidewall 64.

In the next step S230, silicide is formed on the surfaces of the gate electrode G, the source S, the drain D, and the N-type ground shield N61 and the N-type ground shield N150. Thereafter, the manufacturing process of the upper structure of the SOI substrate SUB shown as steps S240 to S310 is the same as the case of the flowchart of FIG. 8, and therefore description thereof will not be repeated.

As described above, the pattern ground shield PGS provided in the SOI region AR1 can be formed by the same process as the process of forming the FDSOI type NMOS transistor NM1. The pattern ground shield PGS provided in the bulk area AR2 can be formed by a process similar to the process of forming the bulk type NMOS transistor NM2.

Effects of the Fifth Embodiment

The height of the pattern ground shield PGS of the SOI region AR1 and the height of the pattern ground shield PGS of the bulk region AR2 adjacent to each other differ by the height of the BOX layer 59 and the single crystal layer (SOI layer) thereon. As a result, the N-type ground shield N61 corresponding to the source S and the drain D in the SOI region AR1 and the N-type ground shield N150 corresponding to the source S and the drain D in the bulk region AR2 are insulated from each other by this difference in height.

Therefore, compared with the case of the semiconductor device S100, 100A to 100H of the first to fourth embodiments, even if the density of the line-like pattern wirings constituting the pattern ground shield PGS is equal, the parasitic capacitance between the line-like patterns can be reduced. As a result, the loss due to the eddy current flowing through the pattern ground shield PGS can be further reduced, and the Q value of the inductor L can be increased.

Variation of the Fifth Embodiment

As in the case of FIGS. 12 and 15, the P-type well PW3 may be formed in the bulk layer 50, and the N-type ground shield N60 of the SOI region AR1 and the N-type ground shield N150 of the bulk region AR2 may be formed in the P-type well PW3.

As in the case of FIGS. 1 and 14, an N-type well may be formed in the bulk layer 50 in the region where the pattern ground shield PGS is to be formed. In the SOI region AR1, a structure similar to the structure of the FDSOI type PMOS transistor is formed on the BOX layer 59, and a P-type impurity region is formed in the N-type well below the BOX layer 59. In the bulk area AR2, structures similar to those of the bulk type PMOS transistor are formed.

Also in such a modified example, the same effect as in the case of FIG. 17 can be obtained.

Sixth Embodiment

The semiconductor device 100 J of the sixth embodiment is a modification of the semiconductor device 100I of the fifth embodiment, and the configuration of the pattern ground shield PGS of the bulk region AR2 is different. More specifically, in the case of the semiconductor device 100J of the sixth embodiment, the pattern ground shield PGS of the bulk region AR2 is composed of only the impurity ground shield. Hereinafter, the sixth embodiment will be specifically described with reference to the drawings.

[Structure of Semiconductor Device]

Figure 19:
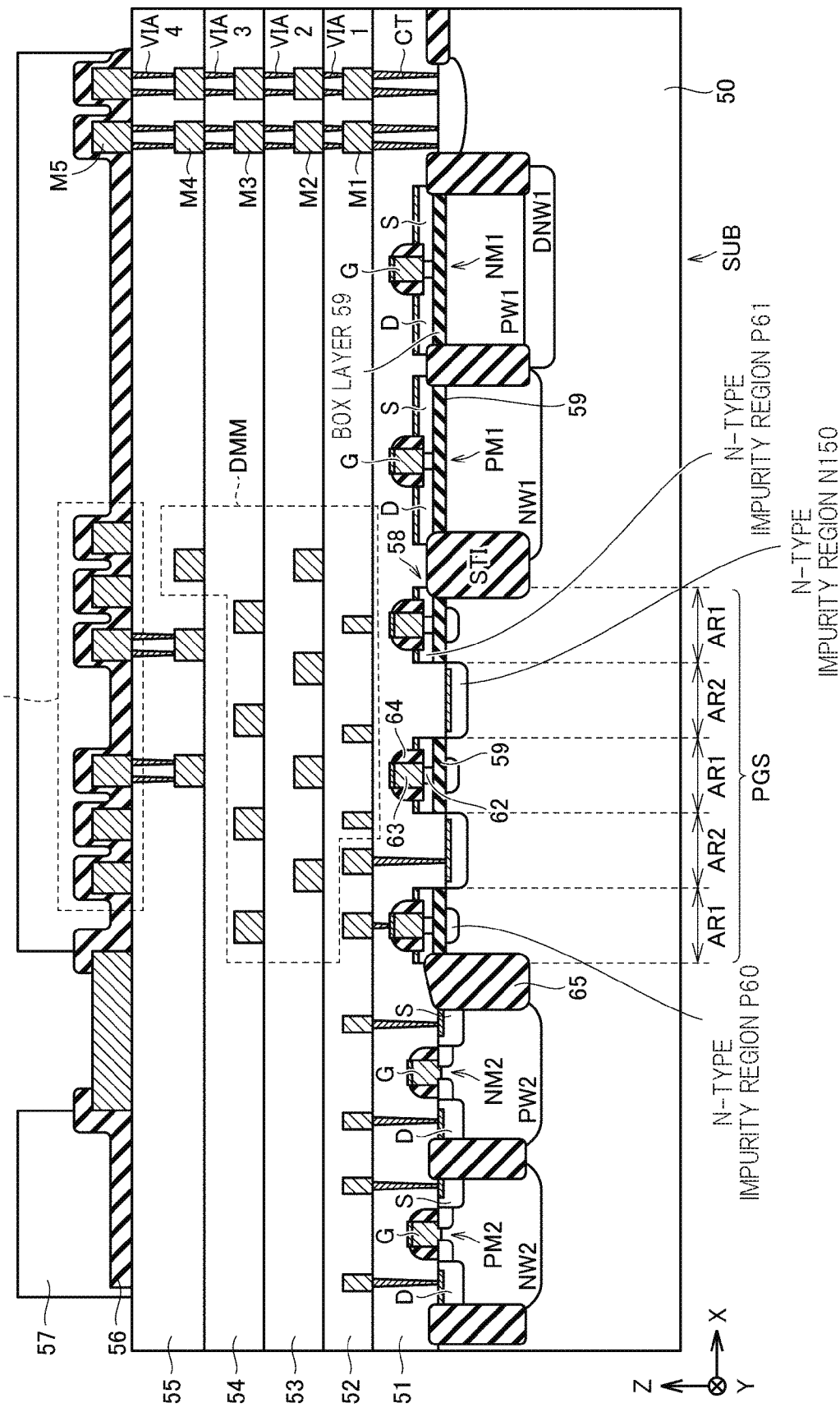
FIG. 19 is a cross-sectional view showing the configuration of the semiconductor device of the sixth embodiment.

FIG. 19 is a cross-sectional view showing the configuration of the semiconductor device of the sixth embodiment.

The pattern ground shield PGS of the bulk region AR2 is composed of only the N-type ground shield N150 formed on the bulk layer 50. Silicide is formed on the surface of the N-type ground shield N150. The N-type ground shield N150 is connected to, for example, a wiring formed in the metal wiring layer M1 via the silicide and the contact CT penetrating the interlayer insulating layer 51.

For example, the N-type ground shield N150 may be formed at the same time when the sources S and the drains D of the FDSOI type PMOS transistor PM1 and the bulk-type PMOS transistor PM2 are formed.

The configuration of the pattern ground shield PGS in the SOI region AR1 and the other configurations of the semiconductor device 100J are the same as those in the case of FIG. 17, and therefore description thereof will not be repeated.

[Method of Manufacturing Semiconductor Device]

Hereinafter, changes from the flowchart of FIG. 18, which shows an example of the manufacturing process of the semiconductor device 100I of the fifth embodiment, will be described.

In step S160 of FIG. 18, the polysilicon layer in the bulk region AR2 is completely removed by etching. In step S170A, the silicon oxide film is formed entirely on the bulk region AR2. The silicon oxide film is removed in step S190. In steps S200 and S220, the N-type ground shield N150 of the bulk region AR2 is formed as the N-type impurity region.

Note that the N-type ground shield N150 of FIG. 19 may be formed as an N-type well in step S130A of FIG. 18. In this case, in steps S200 and S220, the N-type impurity is not ion-implanted into the bulk region AR2.

Effects of the Sixth Embodiment

In the semiconductor device 100J of the sixth embodiment, since the thickness of the N-type ground shield N60 in the direction perpendicular to the SOI substrate is formed relatively thin as described in the fourth embodiment, the parasitic capacitance between the N-type ground shield N60 of the SOI region AR1 and the N-type ground shield N150 of the bulk region AR2 is relatively small. In addition, since the polysilicon ground shield is not provided in the bulk region AR2, it is possible to suppress the parasitic capacitance through the line-like patterns constituting the polysilicon ground shield.

On the other hand, in the configuration of the semiconductor device 100J of FIG. 19, since the N-type ground shield N61 on the BOX layer 59 of the SOI region AR1 and the N-type ground shield N150 of the bulk region AR2 are disposed relatively close to each other, the parasitic capacitance therebetween may become a problem. However, since the N-type ground shields N61 and N150 are separated in the vertical direction by the height of the BOX layer 59, the parasitic capacitance between them is relatively small. As a result, it is possible to suppress the eddy current flowing through the pattern ground shield PGS via the parasitic capacitance, and as a result, it is possible to increase the Q value of the inductor L.

Variation of the Sixth Embodiment

As in the case of FIGS. 12 and 15, the P-type well PW3 may be formed in the bulk layer 50, and the N-type ground shield N60 of the SOI region AR1 and the N-type ground shield N150 of the bulk region AR2 may be formed in the P-type well PW3.

As in the case of FIGS. 1 and 14, an N-type well may be formed in the bulk layer 50 in the region where the pattern ground shield PGS is to be formed. In the SOI region AR1, a structure similar to the structure of the FDSOI type PMOS transistor is formed on the BOX layer 59, and a P-type ground shield is formed in place of the N-type ground shield N60 in the N-type well below the BOX layer 59. Further, in the bulk region AR2, a P-type ground shield is formed in place of the N-type ground shield N150.

Also in such a modified example, the same effect as that in the case of FIG. 19 can be achieved.

Seventh Embodiment

The semiconductor device 100K of the seventh embodiment is a modification of the semiconductor device 100H of the fourth embodiment shown in FIG. 16, and differs in the configuration of the pattern ground shield PGS above the BOX layer 59. Hereinafter, the seventh embodiment will be specifically described with reference to the drawings.

[Structure of Semiconductor Device]

Figure 20:
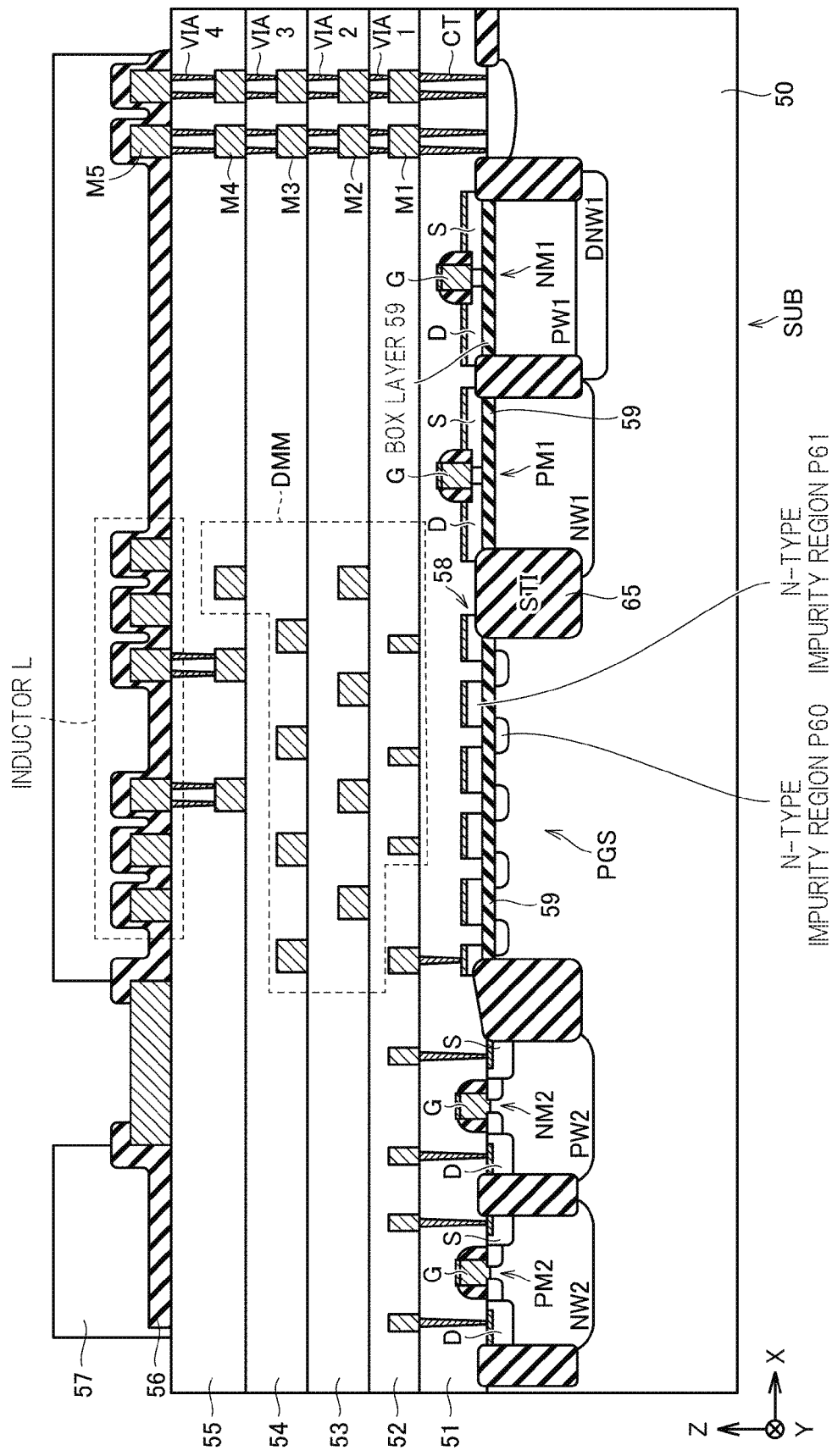
FIG. 20 is a cross-sectional view showing the configuration of the semiconductor device of the seventh embodiment.

FIG. 20 is a cross-sectional view showing the configuration of the semiconductor device of the seventh embodiment.

Referring to FIG. 20, semiconductor device 100K of the seventh embodiment differs from semiconductor device 100H of FIG. 16 in that only N-type impurity region N61 corresponding to source S and drain D is provided on BOX layer 59, and semiconductor layer 62 corresponding to channel region, polysilicon ground shield 63 corresponding to gate electrode G, sidewall 64, and the like are not provided. The adjacent N-type impurity regions N61 are separated from each other by an insulating film such as an oxide film, for example, a part of the interlayer insulating layer 51. Since the rest of the configuration of FIG. 20 is the same as that of FIG. 16, the same or corresponding portions are denoted by the same reference numerals, and description thereof will not be repeated.

[Method of Manufacturing Semiconductor Device]

Next, with reference to the flowchart of FIG. 8, a description will be given of a modification in manufacturing the structure of the semiconductor device 100K of FIG. 20. First, in steps S160 and S170, the gate electrode and the sidewall are not formed in the PGS region 85. Thereafter, after the Si single crystal layer is stacked on the BOX layer 59 in step S180, the surface single crystal layer 58 on the BOX layer 59 is patterned into a pattern ground shield shape. Thereafter, in steps S200 and S220, ion implantation is performed on the patterned surface single crystal layer 58. As a result, the N-type ground shield N61 on the BOX layer 59 shown in FIG. 20 is completed.

Effects of the Seventh Embodiment

In the case of the semiconductor device 100H shown in FIG. 16, the adjacent N-type impurity regions N61 corresponding to the SS and drain D of the FDSOI type NMOS transistor were separated by the semiconductor layers 62 and gate insulating films (not shown) corresponding to the channels. Therefore, the parasitic capacitance between the N-type impurity regions N61 is relatively large, and the loss in the pattern ground shield PGS is large because the eddy current flows through the parasitic capacitance.

On the other hand, in the case of the semiconductor device 100K of FIG. 20, since the adjacent N-type impurity regions N61 are separated from each other by an insulating film, the impedance between them can be increased. As a result, it is possible to suppress the eddy current through the parasitic capacitance, so that the loss in the pattern ground shield PGS is reduced, and as a result, it is possible to further increase the Q value of the inductor L.

Variation of the Seventh Embodiment

Figure 21:
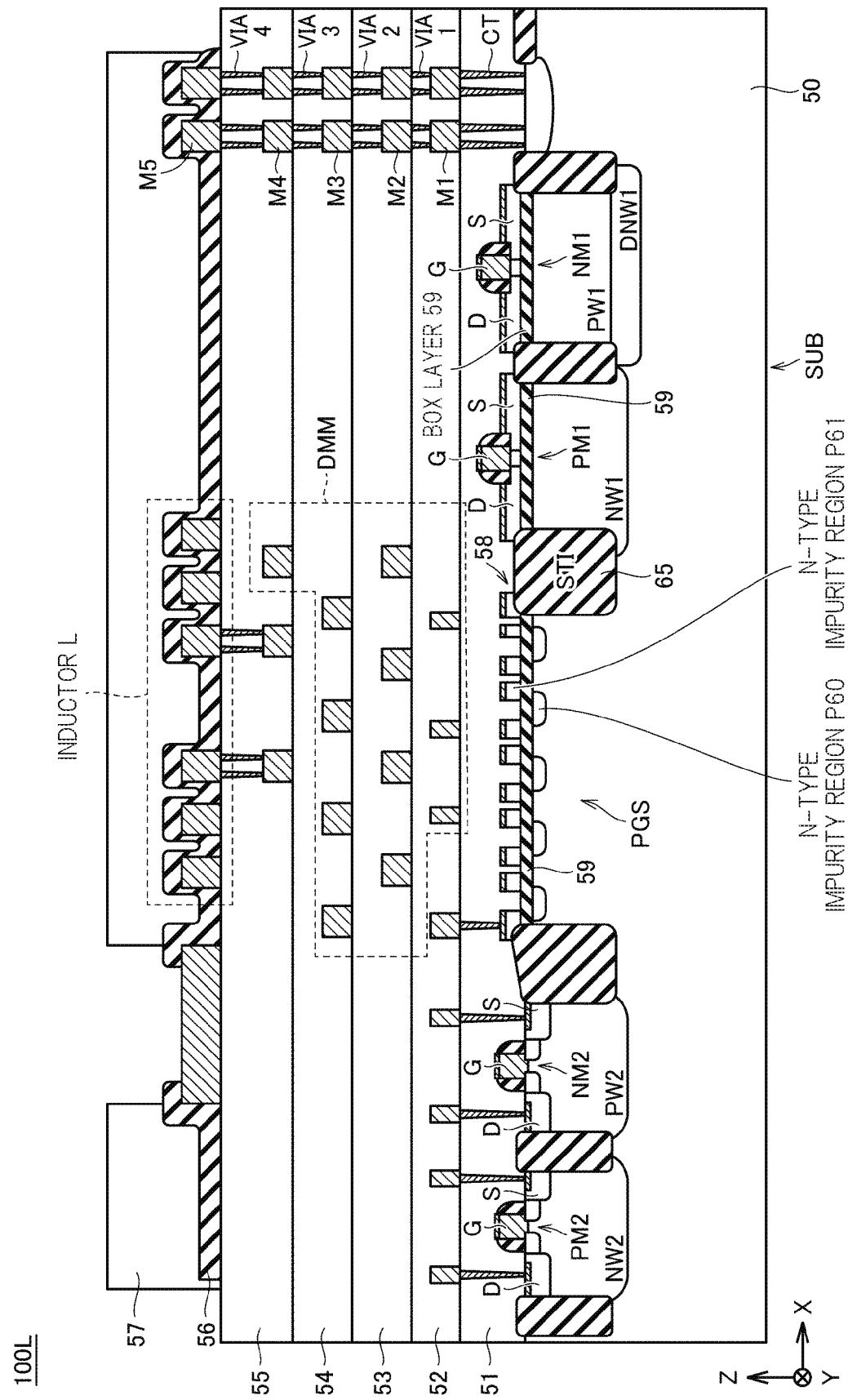
FIG. 21 is a cross-sectional view showing a configuration of a variation of the semiconductor device of FIG. 20.

FIG. 21 is a cross-sectional view showing a configuration of a variation of the semiconductor device of FIG. 20. As shown in FIG. 21, the N-type impurity region N61 on the BOX layer 59 may be further finely separated, and the shape of the pattern of each N-type impurity region N61 is not particularly limited. That is, the pattern pitch of the plurality of line-like patterns constituting the N-type ground shield N61 above the BOX layer 59 may be different from the pattern pitch of the line-like patterns constituting the N-type ground shield N60 below the BOX layer 59. Also in this case, the adjacent N-type impurity regions N61 are separated from each other by an insulating film.

As another modification, similarly to the case of FIGS. 12 and 15, the P-type well PW3 may be formed in the bulk layer 50, and the N-type ground shield N60 may be formed inside the P-type well PW3 under the BOX layer 59.

As in the case of FIGS. 1 and 14, an N-type well may be formed in the bulk layer 50 in the region where the pattern ground shield PGS is formed. In this case, a P-type ground shield is formed in place of the N-type ground shield N60 in the N-well under the BOX layer 59. On the BOX layer 59, a P-type ground shield is formed instead of the N-type ground shield N61.

Eighth Embodiment

The semiconductor device 100 M of the eighth embodiment is a modification of the semiconductor device 100J of the sixth embodiment shown in FIG. 19, and differs in the configuration of the pattern ground shield PGS on the BOX layer 59 in the SOI region AR1. The pattern ground shield PGS of the bulk region AR2 is composed of only the impurity ground shield N150 as described with reference to FIG. 19. Hereinafter, the eighth embodiment will be specifically described with reference to the drawings.
[Structure of Semiconductor Device]

Figure 22:
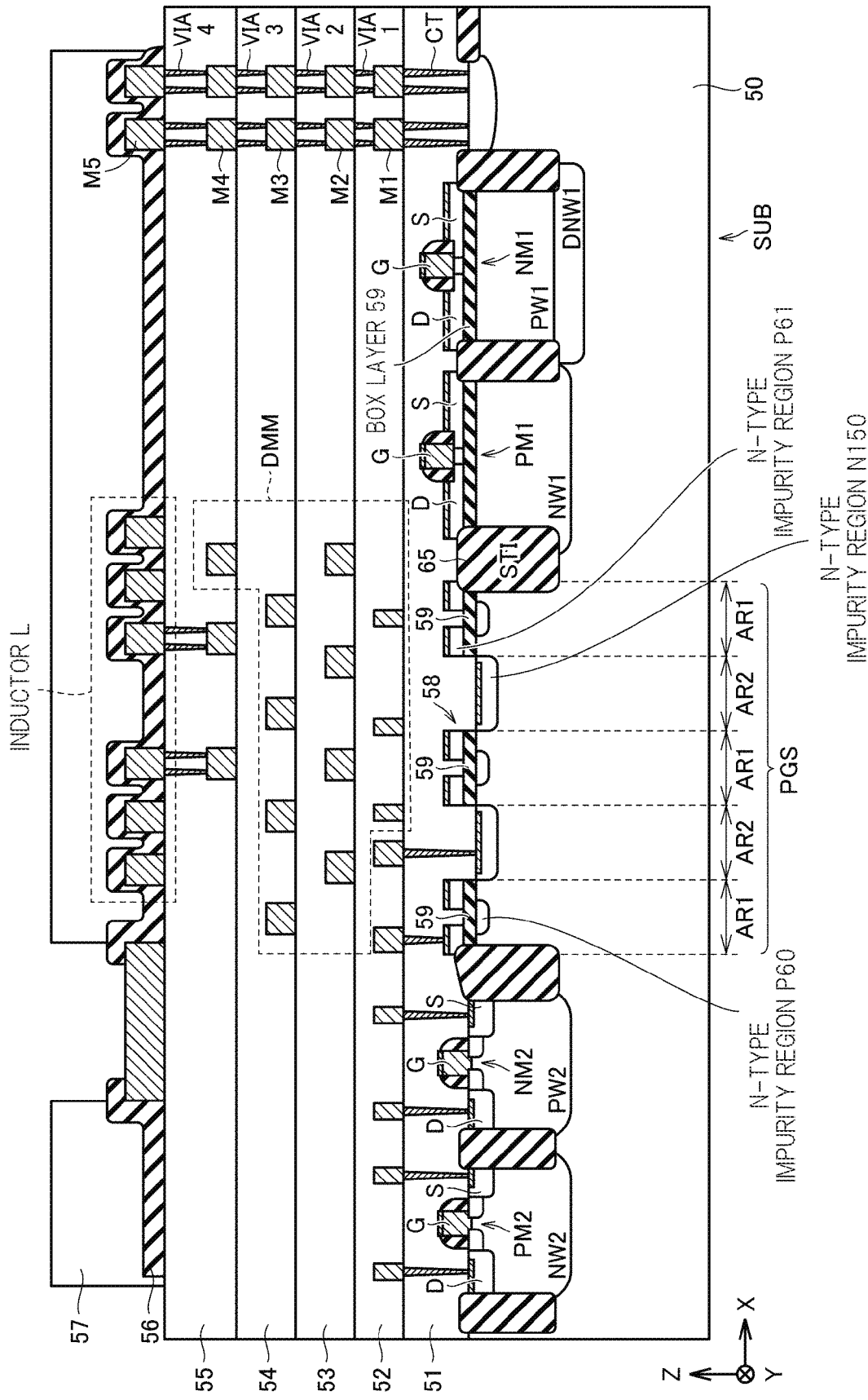
FIG. 22 is a cross-sectional view showing the configuration of the semiconductor device of the eighth embodiment.

FIG. 22 is a cross-sectional view showing the configuration of the semiconductor device of the eighth embodiment.

Referring to FIG. 22, semiconductor device 100 M of the eighth embodiment differs from semiconductor device 100J of FIG. 19 in that only n-type impurity regions N61 corresponding to source S and drain D are provided on BOX layer 59 of SOI region AR1, and semiconductor layer 62 corresponding to channel region, polysilicon ground shield 63 corresponding to gate electrode G, sidewall 64, and the like are not provided. The adjacent N-type impurity regions N61 are separated from each other by an oxide film, for example, a part of the interlayer insulating layer 51. Since the rest of the configuration of FIG. 22 is the same as that of FIG. 19, the same or corresponding portions are denoted by the same reference numerals, and description thereof will not be repeated.
[Method of Manufacturing Semiconductor Device]

Hereinafter, changes from the flowchart of FIG. 18, which shows an example of the manufacturing process of the semiconductor device 100I of the fifth embodiment, will be described.

In step S160 of FIG. 18, the polysilicon layers in the SOI region AR1 and the bulk region AR2 are removed by etching. In step S170A, the silicon oxide film is formed entirely on the bulk region AR2, but not on the surface of the SOI region AR1. In step S180A, Si single crystals are accumulated over the entire surface of the surface single crystal layer 58 of the SOI region AR1. Thereafter, the surface single crystal layer 58 of the SOI region AR1 is patterned into the shape of a patterned ground shield. In step S190, the silicon oxide film on the bulk region AR2 formed in step S170A is removed. In the next steps S200 and S220, N-type impurities are implanted by ion implantation to form the NP-type impurity region P61 of the SOI region AR1 and the N-type ground shield N150 of the bulk region AR2.

Note that the N-type ground shield N150 of the bulk region AR2 shown in FIG. 22 may be formed as an N-type well in step S130A of FIG. 18. In this case, in steps S200 and S220, the N-type impurity is not ion-implanted into the bulk region AR2.

Effects of the Eighth Embodiment

For the semiconductor device 100J shown in FIG. 19, the N-type impurity region (N-type ground shield N61) corresponding to the source S and drain D of the FDSOI NMOS transistor was separated by a semiconductor layer 62 corresponding to the channel and a gate insulating film (not shown). Therefore, the parasitic capacitance between the N-type impurity regions N61 is relatively large, and the loss in the pattern ground shield PGS is large because the eddy current flows through the parasitic capacitance.

On the other hand, in the case of the semiconductor device 100M of FIG. 22, the impedance between adjacent N-type impurity regions (N-type ground shield N61) on the BOX layer 59 can be increased because they are separated by an insulating film. As a result, it is possible to suppress the eddy current through the parasitic capacitance, so that the loss in the pattern ground shield PGS is reduced, and as a result, it is possible to further increase the Q value of the inductor L.

Variation of the Eighth Embodiment

Figure 23:
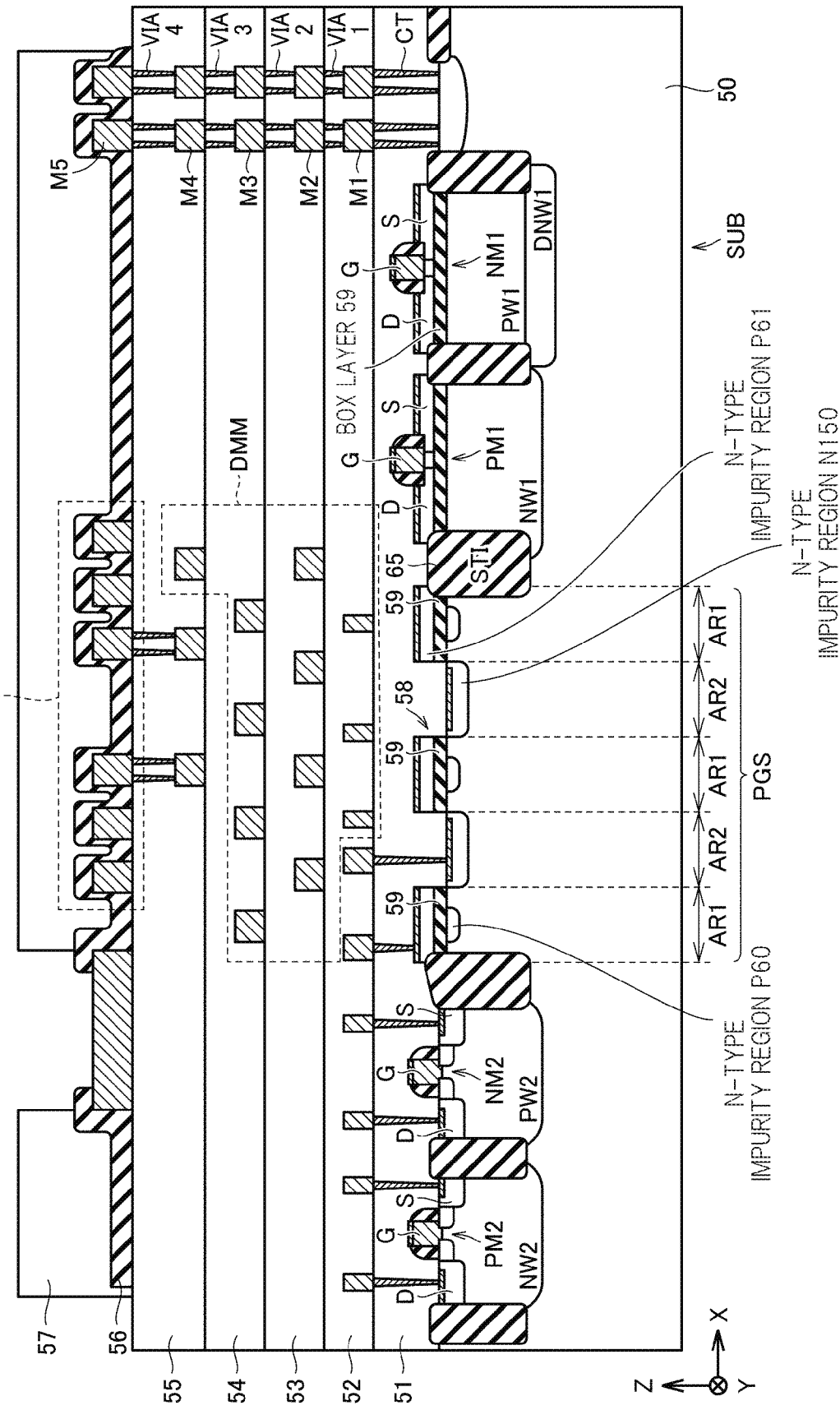
FIG. 23 is a cross-sectional view showing a configuration of a modification of the semiconductor device of FIG. 22.

FIG. 23 is a cross-sectional view showing a configuration of a modification of the semiconductor device of FIG. 22. As shown in FIG. 23, the N-type impurity regions N61 on the BOX layer 59 may be grouped together without separation. In this case, the parasitic capacitance between the N-type impurity region N61 and the N-type ground shield N150 of the bulk region AR2 on the BOX layer 59 disposed relatively close to each other may become a problem. However, since these impurity regions N61 and N150 are separated in the vertical direction by the height of the BOX layer 59, the parasitic capacitance between them is formed small. As a result, it is possible to suppress the eddy current flowing through the pattern ground shield PGS via the parasitic capacitance.

As in the case of FIGS. 12 and 15, a P-type well PW3 may be formed in the bulk layer 50, and an N-type ground shield N60 of the SOI region AR1 and an N-type ground shield N150 of the bulk region AR2 may be formed in the P-type well PW3.

As in the case of FIGS. 1 and 14, an N-type well may be formed in the bulk layer 50 in the region where the pattern ground shield PGS is to be formed. In this case, in the SOI region AR1, a P-type ground shield is formed on the BOX layer 59 in place of the N-type ground shield N61, and a P-type ground shield is formed in place of the N-type ground shield N60 in the N-type well under the BOX layer 59. Further, in the bulk region AR2, a P-type ground shield is formed instead of the N-type ground shield N150.

Ninth Embodiment

The same effect as in the case of FIG. 22 can be obtained in such a modification. The semiconductor device 100 O of the ninth embodiment is a modification of the semiconductor device 100E of the third embodiment shown in FIG. 13, and differs in the configuration of the pattern ground shield PGS below the BOX layer 59. Hereinafter, the ninth embodiment will be specifically described with reference to the drawings.
[Structure of Semiconductor Device]

FIG. 24 is a cross-sectional view showing the configuration of the semiconductor device of the ninth embodiment.

Figure 25A:
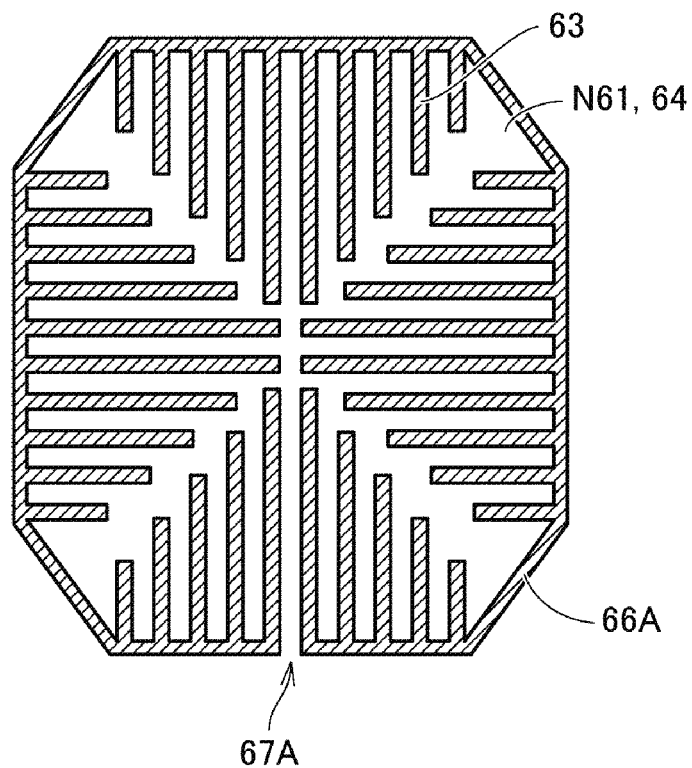
FIGS. 25A and 25B are plan views showing an example of the layout of the pattern ground shield of the semiconductor device of FIG. 24.
Figure 25B:
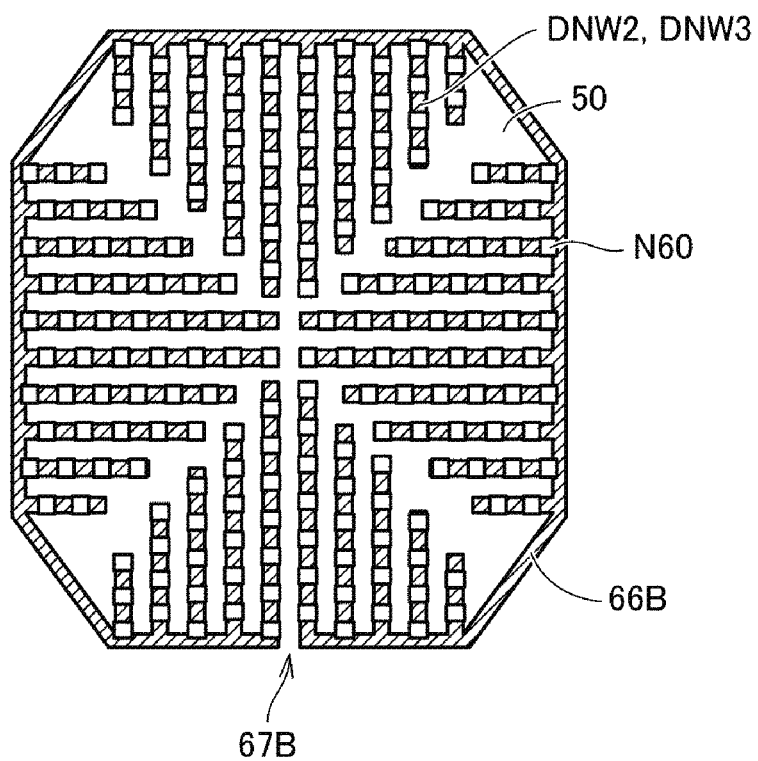

FIG. 25 is a plan view showing an example of the layout of the pattern ground shield of the semiconductor device of FIG. 24. The plan view of FIG. 25A shows the layout of the pattern ground shield PGS above the BOX layer 59, and the plan view of FIG. 25B shows the plan layout of the pattern ground shield PGS below the BOX layer 59.

Referring to FIGS. 24 and 25A, the layout of the pattern ground shield PGS above the BOX layer 59 is the same as that of the semiconductor device 100E of FIG. 13.

Specifically, the polysilicon ground shield 63 includes a plurality of line-like patterns. In the cross-sectional view of FIG. 24, the line pattern formed by the polysilicon ground shield 63 extends in the Y direction. At the outer periphery of the pattern ground shield, the plurality of line-like patterns are connected to each other by a connection wiring 66 A. However, a notch 67A is provided in a part of the connection wiring 66 A so that the induced electromotive current circulating around the pattern ground shield does not flow. Sidewalls 64 are formed on the sidewalls of the line-like pattern of the polysilicon ground shield 63. Further, an N-type ground shield N61, which is an N-type impurity region, is formed between adjacent line-like patterns.

On the other hand, referring to FIG. 24 and FIG. 25B, the N-type ground shield N60 is formed in a columnar shape, i.e., so as to extend in the Z direction, below the BOX layer 59. The lower ends of the N-type ground shields N60 formed in the columnar shape are connected to the lower ends of the other N-type ground shields N60 via the deep N-type well DNW2,DNW3.

The deep N-type well DNW2,DNW3 has a pattern shape similar to the pattern shape of the polysilicon ground shield 63 shown in FIG. 25A in plan view. That is, the deep N-type well DNW2,DNW3 is formed as a plurality of line-like patterns, and constitutes a pattern ground shield PGS. The plurality of line-like patterns are connected to each other by connecting wirings 66B in the outer peripheral portion of the pattern ground shield formed by the deep N-type well DNW2,DNW3. However, a notch 67B is provided in a part of the connection wiring 66B so that the induced electromotive current circulating around the pattern ground shield does not flow.

Since the rest of the configuration of FIG. 24 is the same as that of the semiconductor device 100E of FIG. 13, the same or corresponding portions are denoted by the same reference numerals, and description thereof will not be repeated.

[Method of Manufacturing Semiconductor Device]

Hereinafter, changes from the flowchart of FIG. 8 showing an example of the manufacturing process of the semiconductor device 100 according to the first embodiment will be described.

First, in operation S120, the deep n-type well DNW2, DNW3 constituting the pattern ground shield PGS below the BOX layer 59 is formed by ion implantation.

In operation S130, the P-type well for the bulk-type NMOS transistor and the P-type well for the FDSOI type NMOS transistor are formed by ion implantation. Further, the N-type well for the bulk-type PMOS transistor PM2, the N-type well for the FDSOI type PMOS transistor PM2, and the columnar N-type impurity regions N60 provided under the BOX layers 59 are formed by ion implantation.

In steps S200 and S220, in order to form the N-type ground shield N61, an N-type impurity region is formed in the surface single crystal layer 58 above the BOX layer 59 by ion implantation using a resist pattern as a mask. The other steps of FIG. 8 can be similarly applied to the manufacturing process of the semiconductor device 100 O shown in FIG. 24, and therefore description thereof will not be repeated.

Effects of the Ninth Embodiment

By forming the N-type ground shield N60 under the BOX layer 59 in a columnar shape extending in the Z direction, it is possible to further suppress the generation of eddy currents in the pattern ground shield PGS.

Note that, instead of providing the columnar N-type impurity regions N60 as ground shields, only the line-patterned deep N-type well DNW2, DNW3 may be formed below the BOX layer 59.

Tenth Embodiment

Although the FIG. 2(A) illustrates an example where the inductor L is configured as a planar spiral inductor, the shape of the inductor L may be a three-dimensional solenoid type. The solenoid type makes it possible to concentrate the magnetic flux more in the direction of the winding axis of the inductor. Hereinafter, the tenth embodiment will be described in detail with reference to the drawings.

[Configuration Example of Solenoid Type Inductor]

Figure 26A:
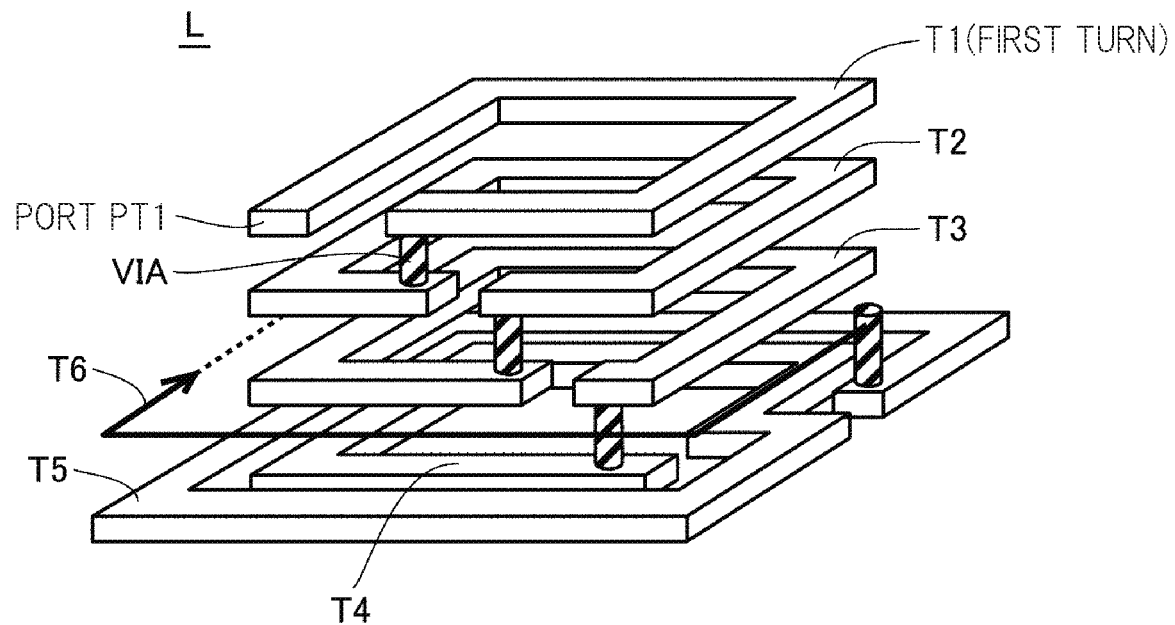
FIGS. 26A and 26B are diagrams showing a configuration example of a three-dimensional solenoid type inductor.
Figure 26B:
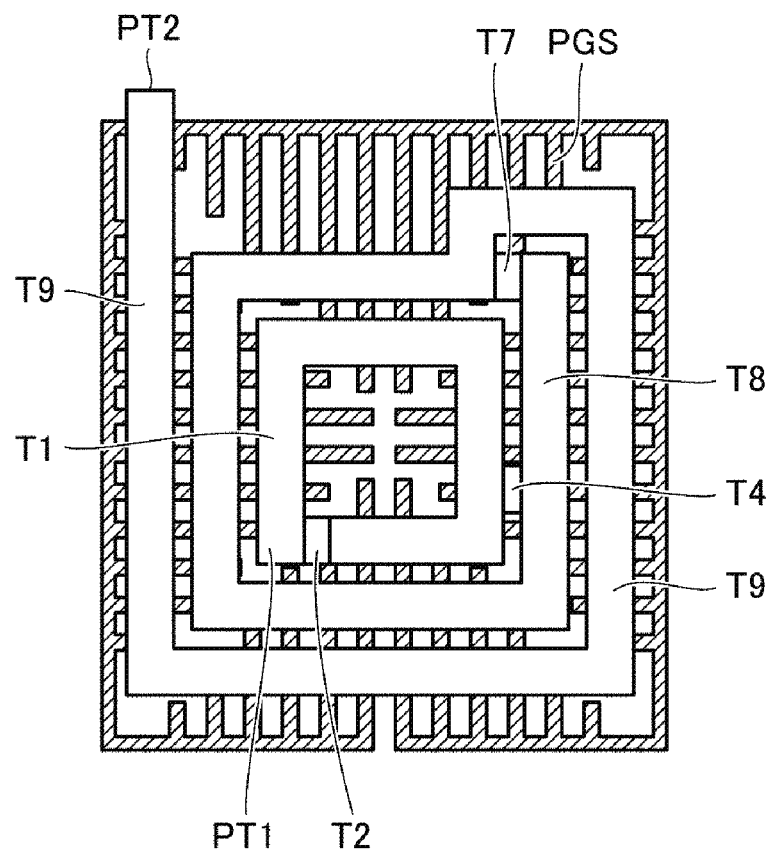

FIG. 26 is a diagram showing a configuration example of a three-dimensional solenoid type inductor. FIG. 26A shows a perspective view of the solenoid type inductor, and FIG. 26B shows a plan view of the solenoid type inductor.

Referring to FIGS. 26A and 26B, a solenoid type inductor L is configured by metal wirings of first to ninth turns T1 to T9.

Specifically, the first turn T1 is formed by the uppermost layer among a plurality of metal wiring layers constituting the inductor L, and one end of the first turn T1 is a port PT1 for inputting and outputting an inductor current. The second turn T2 is formed using a metal wiring layer one layer below the first turn T1, and is connected to the other end of the first turn T1 through a via VIA. The third turn T3 is formed using a metal wiring layer one layer below the second turn T2, and is connected to the second turn T2 through a via. The fourth turn T4 is formed using a metal wiring layer one layer below the third turn T3, and is connected to the third turn T3 through a via. The fourth turn T4 is the lowest layer among the metal wiring layers constituting the inductor L.

The fifth turn T5 is disposed on the outer periphery of the fourth turn T4 by using the metal wiring layer in the same layer as the fourth turn T4, and is connected to the end portion of the fourth turn T4. The sixth turn T6 is formed using a metal wiring layer one layer above the fifth turn T5, which is the same metal wiring layer as the third turn T3, and is connected to the fifth turn T5 through a via. The seventh turn T7 is formed using a metal wiring layer one layer above the sixth turn T6, which is the same metal wiring layer as the second turn T2, and is connected to the sixth turn T6 through a via. The eighth turn T8 is formed using a metal wiring layer one layer above the seventh turn T7, which is the same metal wiring layer as the first turn T1, and is connected to the seventh turn T7 through a via. The eighth turn T8 is the uppermost layer of the metal wiring layers constituting the inductor L.

The ninth turn T9 is arranged on the outer periphery of the eighth turn T8 by using the metal wiring layer in the same layer as the eighth turn T8. One end of the ninth turn T9 is connected to the end of the eighth turn T8. The other end of the ninth turn T9 is used as a port for inputting and outputting an inductor current.

The configuration of the inductor L in FIG. 26 is only an example of a solenoid type. The number of turns, the number of metal wiring layers used, and the shape of each turn may be freely changed.

Eleventh Embodiment

In the eleventh embodiment, examples in which the inductors described in the first to tenth embodiments are applied to voltage-controlled oscillators (hereinafter referred to as LCVCO: LCVoltage Controlled Oscillator) using LC tanks (i.e., parallel LC resonant circuits) will be described. Since LCVCO has characteristics of low noise and high oscillation frequency, it is frequently used in recent years. In the eleventh embodiment, examples in which the LCVCO is applied to communication circuits will be described.

[Circuit Configuration of LCVCO]

Figure 27:
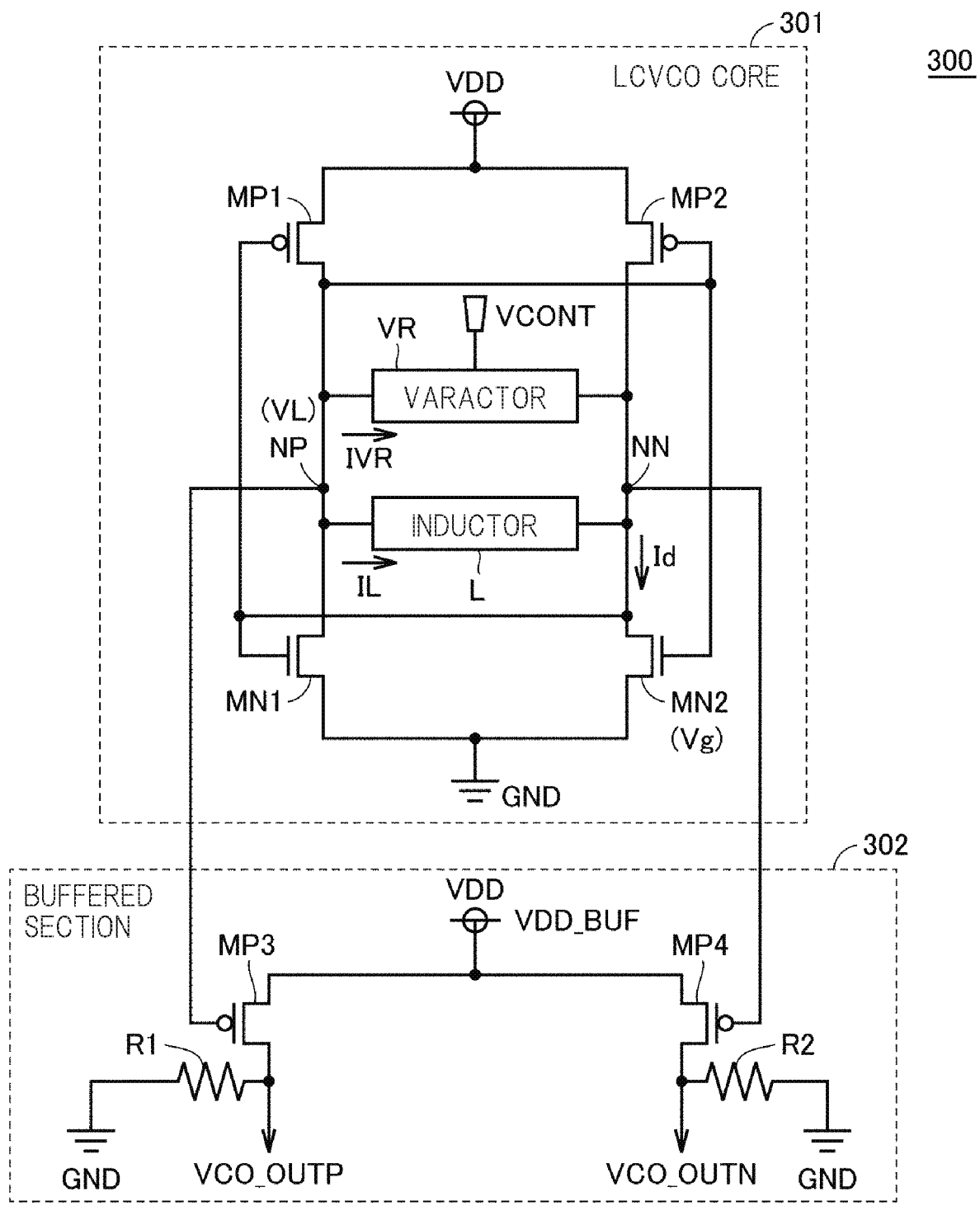
FIG. 27 is a circuit diagram showing an exemplary configuration of a LCVCO.

FIG. 27 is a circuit diagram showing an exemplary configuration of a LCVCO. Referring to FIG. 27, the LCVCO 300 includes a LCVCO core unit 301 and a buffering unit 302.

1. LCVCO Core Portion

The core portion 301 includes an inductor L, a varactor VR as a variable capacitor, a pair of P-channel MOS transistors MP1 and MP2, and a pair of N-channel MOS transistors MN1 and MN2. Hereinafter, these connection relationships will be described.

The source of the PMOS transistor MP1 is connected to a node to which the power supply voltage VDD is applied, and the drain of the transistor MP1 is connected to a first output node NP. The source of the PMOS transistor MP2 is connected to the power supply node VDD, and the drain thereof is connected to the second output node NN. The gate of the PMOS transistor MP1 is connected to the second output node NN, and the gate of the PMOS transistor MP2 is connected to the first output node NP. As described above, the pair of PMOS transistors MP1 and MP2 has a structure in which gates and drains are connected to each other, that is, a so-called cross-coupled structure.

The source of the NMOS transistor MN1 is connected to a node to which the ground voltage GND is applied, and the drain of the transistor MN1 is connected to a first output node NP. The source of the NMOS transistor MN2 is connected to the grounding node GND, and the drain of the transistor MN2 is connected to the second output node NN. The gate of the NMOS transistor MN1 is connected to the second output node NN, and the gate of the NMOS transistor MN2 is connected to the first output node NP. In this manner, the pair of NMOS transistors MN1 and MN2 also have a cross-coupled configuration.

The inductor L and the varactor VR are connected in parallel with each other between the first output node NP and the second output node NN. The capacitance of the varactor VR varies according to the control voltage VCONT.

According to the above-described circuit configuration, the inductor L and the varactor VR resonate in parallel at frequencies corresponding to the control voltages VCONT. Further, the PMOS transistors MP1 and MP2 and the NMOS transistors MN1 and MN2 function as negative resistors, so that the cores 301 continuously oscillate at the parallel resonant frequencies described above.

In this disclosure, one of the power supply node VDD and the ground node GND may be referred to as a first power supply node, and the other may be referred to as a second power supply node.

2. Buffer Unit

The buffer unit 302 is provided to adjust the voltage level and the output impedance of the output signal. The configuration of the buffer unit 302 in FIG. 27 is only an example, and is not limited to this circuit configuration.

Specifically, in FIG. 27, the buffering unit 302 includes PMOS transistors MP3 and MP4 and resistive elements R1 and R2. These connections are as follows.

The source of the PMOS transistor MP3 is connected to a node to which the power supply voltage VDD_BUF for the buffering unit 302 is applied, hereinafter referred to as a power supply node VDD_BUF, and the drain thereof is connected to one end of the resistor R1. The other end of the resistive element R1 is connected to the ground node GND. The gates of the PMOS transistors MP3 are connected to the first output nodes NPs of the cores 301.

Similarly, the source of the PMOS transistor MP4 is connected to a node to which the power supply voltage VDD_BUF for the buffer portion 302 is provided (hereinafter referred to as the power supply node VDD_BUF), and the drain is connected to one end of the resistor element R2. The other end of the resistive element R2 is connected to the ground node GND. The gates of the PMOS transistors MP4 are connected to the second output nodes NN of the cores 301.

In the buffering unit 302 having the above configuration, differential output signals VCO_OUTP and VCO_OUTN are output from the sources of the PMOS transistors MP3 and MP4. When a single-ended output signal is obtained, only one of the output node NP and the output node NN may be output through the buffer.

[Configuration Example of Communication Circuit]

Figure 28:
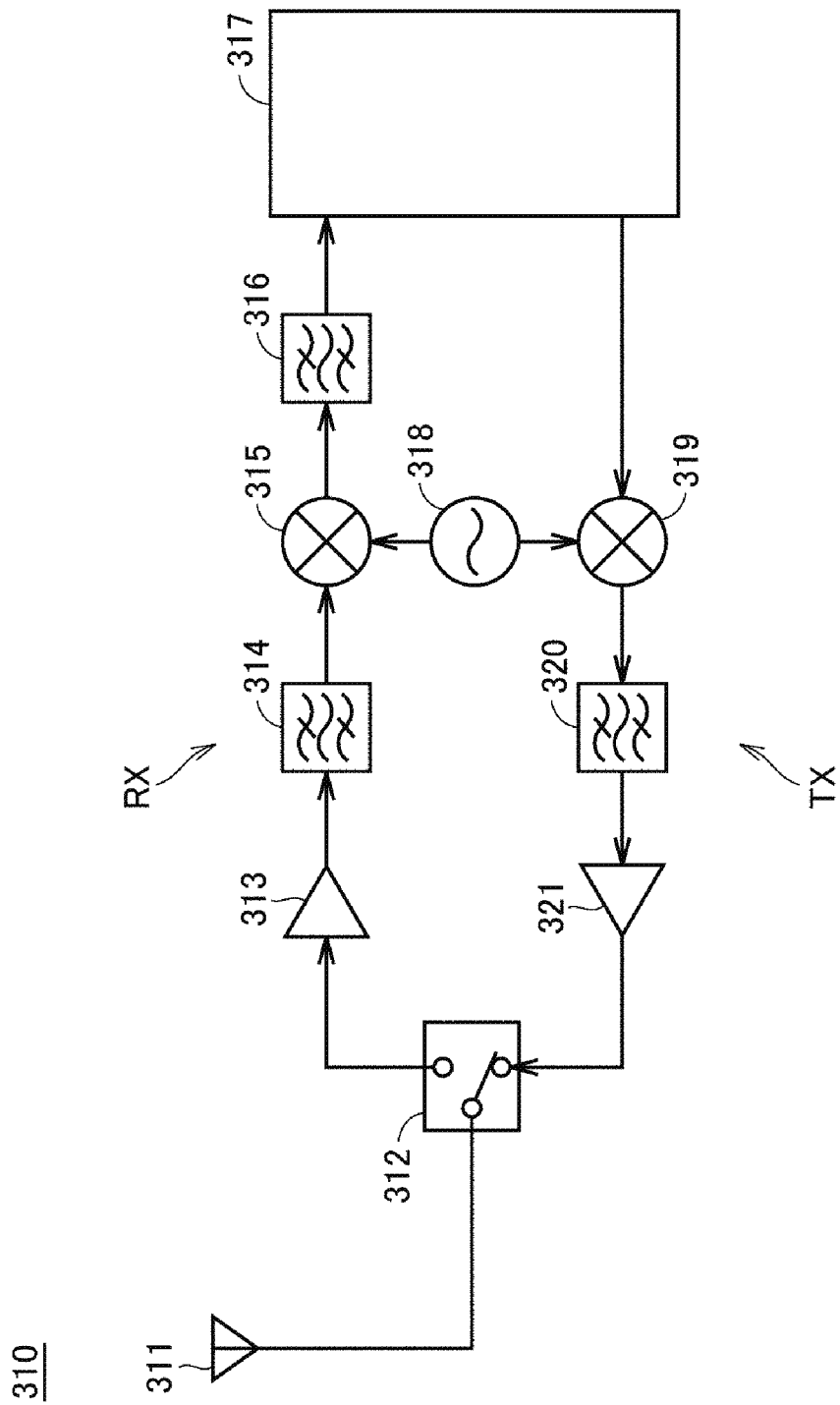
FIG. 28 is a circuit diagram showing an example of the configuration of a communication circuit.

FIG. 28 is a circuit diagram showing an example of the configuration of a communication circuit. The communication circuit 310 is a circuit for performing wireless communication with other devices. Therefore, the communication circuit 310 includes a reception circuit RX for performing reception processing and a transmission circuit TX for performing transmission processing. Note that at least some of the components of the communication circuit 310 in FIG. 28 except for the antenna 311 can be mounted as a semiconductor device in one package.

Referring to FIG. 28, communication circuit 310 includes antennas 311, switches 312, LNAs (Low Noise Amplifier) 313, filters 314, mixers 315, I/F filters 316, base band circuits 317, local oscillators 318, mixers 319, filters 320, and PAs (Power Amplifier) 321.

The receiving circuit RX includes antennas 311, switches 312, a LNA 313, a filter 314, a mixer 315, an I/F filter 316, a base band circuit 317, and a local oscillator 318. The transmitter circuits TX include local oscillators 318, mixers 319, filters 320, PA 321, switches 312, and antennas 311. The antenna 311, the switch 312, the baseband circuit 317, and the local oscillator 318 are shared by the transmission circuit TX and the reception circuit RX.

The antenna 311 receives a radio wave from the space as a high frequency signal, and transmits the high frequency signal to the space as a radio wave. The switch 312 switches the path of the high frequency signal according to transmission or reception. That is, upon receipt, switch 312 connects antenna 311 with LNA 313 and, upon transmission, antenna 311 with PA 321.

First, the receiving circuit RX will be described. A high frequency signal is inputted as a reception signal to the LNA 313 from the antennas 311 through the switches 312. The LNA 313 is a receiving amplifier for amplifying received signals. The LNA 313 outputs the received signals to filters 314. The filter 314 removes unnecessary band components included in the received signal. The received signal from the filter 314 is input to the mixer 315.

The local oscillator 318 generates a local signal having a predetermined frequency. The local oscillator 318 outputs a local signal to the mixer 315. The mixer 315 demodulates the received signal using the local signal. The reception signal demodulated by the mixer 315 is input to the baseband circuit 317 via the I/F filter 316. The baseband circuit 317 includes an A/D converter, a baseband processor, and the like. The baseband circuit 317 generates reception data based on the reception signal.

Next, the transmission circuit TX will be described. The baseband circuit 317 includes a D/A converter and the like, and generates a transmission signal which is a baseband signal based on transmission data. The baseband circuit 317 outputs a transmission signal to the mixer 319. The local oscillator 318 outputs a local signal to the mixer 319. The mixer 319 modulates the transmission signal using the local signal. The mixer 319 outputs the modulated transmission signal to the filter 320. The filter 320 removes unnecessary band components included in the transmission signal. The filter 320 outputs the transmitted signal to the PA 321. The PA 321 is a transmission amplifier for amplifying transmission signals. The PA 321 outputs transmit signals to the antennas 311 via the switches 312. In this manner, the transmission circuit TX performs transmission processing.

Figure 29:
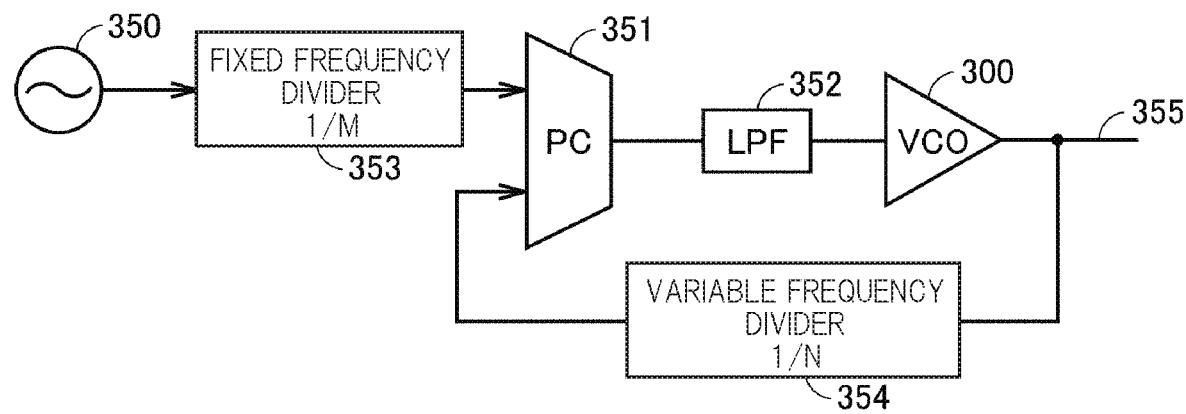
FIG. 29 is a block diagram showing an example of the configuration of the local oscillator shown in FIG. 28.

FIG. 29 is a block diagram showing an example of the configuration of the local oscillator shown in FIG. 28. The local oscillator 318 of FIG. 29 uses a phase locked loop (Phase Lock Loop).

Referring to FIG. 29, the local oscillator 318 includes a phase comparator 351 (PC: Phase Comparator), a loop filter 352 (LPF: Loop Filter), the LCVCO 300 described in the first to sixth embodiments, a fixed frequency divider 353, and a variable frequency divider 354.

The fixed frequency divider 353 outputs a signal obtained by dividing the clock signal output from the reference oscillator 350 using a crystal oscillator or the like by M (i.e., a signal having a frequency 1/M of the frequency of the clock signal). Here, the division factor of the fixed frequency divider 353 is assumed to be a fixed value, but may be variable.

The phase comparator 351 detects a phase difference between a signal obtained by dividing the clock signal by M and an output signal of the variable frequency divider 354, that is, a feedback signal. The loop filter 352 is a low-pass filter for smoothing the output signal of the phase comparator 351.

The LCVCO 300 generates local signals 355 having frequencies corresponding to the voltages inputted from the loop filter 352. The generated local signal 355 is output to the mixers 315 and 319 of FIG. 28 as an output signal of the local oscillator 318, and is input to the variable frequency divider 354.

The variable frequency divider 354 outputs a signal obtained by dividing the input local signal 355 by N (i.e., a signal having a frequency 1/N of the frequency of the local signal 355) to the phase comparator 351 as a feedback signal. Here, it is assumed that the frequency division rate of the variable frequency divider 354 is variable, that is, can be controlled from the outside.

In the local oscillator 318 having the above-described configuration, if the frequency of the clock signal output from the reference oscillator 350 is fin and the frequency of the local signal 355 output from the LCVCO 300 is fout, the relation fin/M=fout/N holds. Therefore, the frequency fout of the local signal 355 is fin×N/M.

In the local oscillator 318 of FIG. 29, the PGS layer described in the first to ninth embodiments is provided immediately below the inductor provided in the LCVCO 300. As a result, the Q value of the inductor can be increased. As a result, the power consumed by the LCVCO 300 can be reduced, and phase noises included in the local signals 355 can be reduced. The signal quality of the transmission wave transmitted from the communication circuit 310 and the quality of the received data obtained from the received signal can be enhanced.

<<Additional Remark>>

Hereinafter, some of the features of each of the above embodiments will be described.

(Appendix 1) A semiconductor device comprising:
a semiconductor substrate including a bulk layer,
a buried oxide layer provided in at least a partial region on the bulk layer, and
a surface single crystal layer on the buried oxide layer;
an inductor provided above a main surface side of the semiconductor substrate on which the surface single crystal layer is disposed; and a first ground shield which is an impurity region formed in the bulk layer below the inductor and below the buried oxide layer.

(Appendix 2) The semiconductor device according to Appendix 1, further comprising a second ground shield formed of a polysilicon layer located below the inductor and above the surface single crystal layer.

(Appendix 16) The semiconductor device according to Appendix 1, further comprising a second ground shield which is an impurity region formed in the surface single crystal layer below the inductor.

(Appendix 19) A method for manufacturing a semiconductor device, comprising: providing a semiconductor substrate including a bulk layer, a buried oxide layer on the bulk layer, and a surface single crystal layer on the buried oxide layer; forming a first ground shield, which is an impurity region, in the bulk layer below the buried oxide layer by ion implantation from the main surface side of the semiconductor substrate provided with the surface single crystal layer; forming a metal wiring layer on the main surface side of the semiconductor substrate; and forming an inductor above the first ground shield using the metal wiring layer.

(Appendix 20) The method of manufacturing a semiconductor device according to Appendix 19, further comprising the steps of: forming an insulating layer and a polysilicon layer on the surface single crystal layer of the semiconductor substrate; and forming a second ground shield above the first ground shield by patterning the polysilicon layer.

(Appendix 21) The semiconductor device of Appendix 1, further comprising a first deep well connected to a lower end of an impurity region comprising the first ground shield, wherein the first deep well is provided with a fixed potential.

(Appendix 22) The semiconductor device of Appendix 1, wherein the impurity region comprising the first ground shield comprises an exposed portion in which the buried oxide layer is not provided above, and wherein the exposed portion is provided with a fixed potential via a contact.

(Appendix 23) The semiconductor device according to Appendix 2, wherein each of the first ground shield and the second ground shield includes a plurality of line-like patterns when the semiconductor substrate is viewed in plan, and the pattern pitch of the plurality of line-like patterns constituting the first ground shield is wider than the pattern pitch of the plurality of line-like patterns constituting the second ground shield.

(Appendix 24) The semiconductor device of Appendix 23, wherein the linewidths of each line-like pattern constituting the first ground shield are greater than the linewidths of each line-like pattern constituting the second ground shield.

(Appendix 25) The semiconductor device according to Appendix 2, wherein each of the first ground shield and the second ground shield includes a plurality of line-like patterns when the semiconductor substrate is viewed in plan, and the plurality of line-like patterns constituting the first ground shield overlap a plurality of line-like patterns constituting the second ground shield when the semiconductor substrate is viewed in plan.

(Appendix 26) The semiconductor device according to Appendix 2, wherein each of the first ground shield and the second ground shield includes a plurality of line patterns in plan view of the semiconductor substrate, and the plurality of line patterns constituting the first ground shield and the plurality of line patterns constituting the second ground shield are alternately arranged with each other in plan view of the semiconductor substrate.

(Appendix 27) The semiconductor device of Appendix 16, wherein the second ground shield comprises a plurality of line-like patterns, wherein adjacent line-like patterns among the plurality of line-like patterns are separated by an insulating film, viewing the semiconductor substrate in plane.

(Appendix 28) The semiconductor device of Appendix 16, wherein (Appendix 28) viewing the semiconductor substrate in plane, each of the first ground shield and the second ground shield comprises a plurality of line-like patterns, different from the plurality of line-like pattern pitches constituting the first ground shield and the plurality of line-like pattern pitches constituting the second ground shield.

(Appendix 29) The semiconductor device of Appendix 1, wherein the inductor has a spiral or meander or solenoid structure formed of one or more metal wiring layers on the main surface side of the semiconductor substrate.

(Appendix 30) The method of manufacturing a semiconductor device according to Appendix 20, further comprising the step of forming a third ground shield, which is an impurity region, in the surface single crystal layer by performing ion implantation from the main surface side of the semiconductor substrate except at least the region where the second ground shield is formed.

(Appendix 31) The method of manufacturing a semiconductor device according to Appendix 19, further comprising the step of forming a first well by ion implantation into the bulk layer so as to include an impurity region constituting the first ground shield before the step of forming the first ground shield.

(Appendix 32) The method of manufacturing a semiconductor device according to Appendix 19, wherein the region of the semiconductor substrate below the inductor includes a first region and a second region in plan view, and wherein the step of forming the first ground shield is performed by ion implantation into the bulk layer of the first region, and the method of manufacturing the semiconductor device further comprises the steps of: exposing the bulk layer by removing the buried oxide layer and the surface single crystal layer of the second region; depositing an insulating layer and a polysilicon layer on the main surface side of the semiconductor substrate; forming a second ground shield above the surface single crystal layer of the first region by patterning the polysilicon layer; and forming a third ground shield above the bulk layer of the second region.

(Appendix 33) The method of manufacturing a semiconductor device according to Appendix 32, further comprising the steps of: forming a fourth ground shield, which is an impurity region, in the surface single crystal layer of the first region by performing ion implantation from the main surface side of the semiconductor substrate to a part of the first region except at least the region where the second ground shield is formed; and forming a fifth ground shield, which is an impurity region, in the bulk layer of the second region by performing ion implantation from the main surface side of the semiconductor substrate to a part of the second region except at least the region where the third ground shield is formed.

(Appendix 34) The method of manufacturing a semiconductor device according to Appendix 19, wherein the region of the semiconductor substrate below the inductor includes a first region and a second region in plan view, and wherein the step of forming the first ground shield includes ion implantation into the bulk layer of the first region, and wherein the method of manufacturing the semiconductor device further comprises: exposing the bulk layer by removing the buried oxide layer and the surface single crystal layer of the second region; forming a second ground shield, which is an impurity region, in the surface single crystal layer of the first region by ion implantation from the main surface side of the semiconductor substrate; and forming a third ground shield, which is an impurity region, in the bulk layer of the second region by ion implantation from the main surface side of the semiconductor substrate into the portion of the second region by ion implantation from the main surface side of the semiconductor substrate.

(Appendix 35) A region of the semiconductor substrate below the inductor includes a first region and a second region in plan view of the semiconductor substrate, and in the step of forming the first ground shield, ion implantation of the first region into the bulk layer is performed, and the method of manufacturing the semiconductor device further includes the steps of: exposing the bulk layer by removing the buried oxide layer and the surface single crystal layer of the second region; forming an insulating layer and a polysilicon layer on the main surface side of the semiconductor substrate; forming a second ground shield on the surface single crystal layer of the first region by patterning the polysilicon layer; forming a third ground shield, which is an impurity region, on the first region from the main surface side of the semiconductor substrate by performing ion implantation from the main surface side of the semiconductor substrate by removing at least the region where the second ground shield is formed; and forming a third ground shield, which is an impurity region, on the first region from the main surface single crystal side of the semiconductor substrate, wherein. the method of manufacturing a semiconductor device according to claim 19, further comprising the step of forming a fourth ground shield, which is an impurity region, in the bulk layer by performing ion implantation from the main surface side of the semiconductor substrate into a part of the second region.

(Appendix 36) The method of manufacturing a semiconductor device according to Appendix 19, further comprising the step of forming a second ground shield, which is an impurity region, in the surface single crystal layer by performing ion implantation from the main surface side of the semiconductor substrate.

(Appendix 37) The method for manufacturing a semiconductor device as described in Appendix 19, wherein the impurity regions comprising the first ground shield are formed as deep wells.

(Appendix 38) The method of manufacturing a semiconductor device according to Appendix 37, further comprising the step of forming a plurality of columnar impurity regions each extending in a direction perpendicular to the semiconductor substrate and reaching the first ground shield at a lower end in the bulk layer by ion implantation from the main surface side of the semiconductor substrate.

(Appendix 39) The semiconductor device according to any one of Appendices 1, 2, 16, and 21 to 29, further comprising: a variable capacitor connected across the inductor; and a transistor pair connected across the inductor, wherein the inductor, the variable capacitor, and the transistor pair constitute a voltage controlled oscillator.

(Appendix 40) The semiconductor device according to Appendix 39, comprising: a mixer for modulating a transmission signal or demodulating a reception signal; and a local oscillator for generating a local signal to be supplied to the mixer, wherein the local oscillator includes a phase locked loop including the voltage controlled oscillator.

Although the invention made by the present inventor has been specifically described based on the embodiment, the present invention is not limited to the embodiment described above, and it is needless to say that various modifications can be made without departing from the gist thereof.

What is claimed is:
1. A semiconductor device comprising:
a semiconductor substrate including a bulk layer;
a buried oxide layer provided on the bulk layer;
an inductor provided above a main surface side of the semiconductor substrate; and
a first ground shield which is an impurity region formed in the bulk layer below the inductor and below the buried oxide layer,
wherein, in plan view of the semiconductor substrate, a region below the inductor includes:
a first region in which both the buried oxide layer and a surface single crystal layer are provided; and
a second region in which neither the buried oxide layer nor the surface single crystal layer is provided,
wherein the first ground shield is provided below the buried oxide layer in the first region, and
wherein the semiconductor device further includes a second ground shield which is an impurity region formed in the bulk layer in the second region.
2. The semiconductor device of claim 1,
wherein the surface single crystal layer is formed on the buried oxide layer, and
wherein the second ground shield is formed of a polysilicon layer located below the inductor and above the surface single crystal layer.
3. The semiconductor device according to claim 2, further comprising a third ground shield which is an impurity region formed in the surface single crystal layer below the inductor.
4. The semiconductor device of claim 3, wherein the third ground shield is disposed adjacent to the second ground shield in plan view of the semiconductor substrate when the semiconductor substrate is viewed from above.
5. The semiconductor device of claim 1, further comprising a first well formed in the bulk layer to include an impurity region comprising the first ground shield,
wherein the impurity region comprising the first ground shield has a first conductivity type, and
wherein the first well has a second conductivity type opposite to the first conductivity type.
6. The semiconductor device of claim 1, wherein the impurity region constituting the first ground shield has a first conductivity type, and the bulk layer has a second conductivity type opposite to the first conductivity type.
7. The semiconductor device according to claim 1,
wherein the impurity region constituting the first ground shield has a first conductivity type, and the semiconductor device further comprises:
a first MOS (Metal Oxide Semiconductor) transistor formed using the surface single-crystal layer at a position different from the position where the inductor is arranged in plan view of the semiconductor substrate; and
a second well of the first conductivity type formed in the bulk layer below the first MOS transistor, and
wherein a thickness of the impurity region constituting the first ground shield along the direction perpendicular to the semiconductor substrate is smaller than a thickness of the second well along the direction perpendicular to the semiconductor substrate.
8. The semiconductor device according to claim 7, wherein an impurity concentration of the impurity region constituting the first ground shield is larger than an impurity concentration of the second well.
9. The semiconductor device of claim 1, further comprising a third ground shield formed of a polysilicon layer located above the surface single crystal layer of the first region.
10. The semiconductor device according to claim 9, further comprising a fourth ground shield which is an impurity region formed in the surface single crystal layer of the first region.
11. The semiconductor device of claim 10, wherein the fourth ground shield is disposed adjacent to the third ground shield in plan view of the semiconductor substrate.
12. The semiconductor device of claim 10, further comprising a fifth ground shield formed of a polysilicon layer overlying the bulk layer in the second region.
13. The semiconductor device of claim 12, wherein the second ground shield is disposed adjacent to the fifth ground shield in plan view of the semiconductor substrate.
14. The semiconductor device according to claim 1, further comprising a third ground shield which is an impurity region formed in the surface single crystal layer of the first region.
15. The semiconductor device according to claim 1, wherein the second ground shield is formed in the surface single crystal layer below the inductor.
16. The semiconductor device of claim 1, wherein the impurity region constituting the first ground shield is formed as a deep well.
17. The semiconductor device of claim 16, further comprising a plurality of columnar impurity regions formed in the bulk layer between the buried oxide layer and the first ground shield, each columnar impurity region extending in a direction perpendicular to the semiconductor substrate, and a lower end of each columnar impurity region is connected to the first ground shield.

* * * * *